United States Patent
Kanayama et al.

(10) Patent No.: US 6,172,446 B1
(45) Date of Patent: *Jan. 9, 2001

(54) PIEZOELECTRIC OSCILLATOR COMPONENT, STRUCTURE FOR SUPPORTING PIEZOELECTRIC OSCILLATOR AND METHOD OF MOUNTING PIEZOELECTRIC OSCILLATOR

(75) Inventors: Kouichi Kanayama; Shusaku Takagi; Mitsunobu Yoshida; Yasushi Iwata, all of Sodegaura (JP)

(73) Assignee: Mitsui Chemicals, Inc., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/029,229
(22) PCT Filed: Aug. 22, 1996
(86) PCT No.: PCT/JP96/02350
  § 371 Date: Feb. 25, 1998
  § 102(e) Date: Feb. 25, 1998
(87) PCT Pub. No.: WO97/08760
  PCT Pub. Date: Mar. 6, 1997

(30) Foreign Application Priority Data

Aug. 25, 1995 (JP) .................................................. 7-240831
Mar. 19, 1996 (JP) .................................................. 8-090274

(51) Int. Cl.[7] .................................................. H01L 41/08
(52) U.S. Cl. .................................................. 310/348; 359/366
(58) Field of Search .................................................. 310/359, 348, 310/366

(56) References Cited

U.S. PATENT DOCUMENTS

| 5,229,680 | * | 7/1993 | Sato et al. | 310/366 |
| 5,329,682 |   | 7/1994 | Thurn et al. | 29/25.35 |
| 5,392,012 |   | 2/1995 | Iwata et al. | 333/189 |
| 5,589,724 | * | 12/1996 | Satoh et al. | 310/348 |
| 5,699,027 | * | 12/1997 | Tsuji et al. | 310/348 |

FOREIGN PATENT DOCUMENTS

| 779029 | 3/1995 | (JP) | H01L/41/107 |
| 07131088 | 5/1995 | (JP) | H01L/41/107 |

* cited by examiner

*Primary Examiner*—Thomas M. Dougherty
(74) *Attorney, Agent, or Firm*—Birch, Stewart, Kolasch & Birch, LLP

(57) ABSTRACT

A piezoelectric oscillator element (100) constituting a piezoelectric transformer is supported by lead frames (32, 34, 36). One of the ends of the lead frame (32) is welded to a primary side electrode (22) at a connection portion (31), and the other end is welded to a land (42). One of the ends of the lead frame (34) is welded to a primary side electrode (24) at a connection portion (33) and the other end is welded to a land (44). One of the ends of the lead frame (36) is welded to a secondary side electrode (26) at a connection portion (35) and the other end is welded to a land (46). The connection portions (31 and 33) are positioned at a node A of oscillation. Since the electrical and mechanical connection is achieved by the lead frames (32, 34, 36), the structure is simple, the thickness of the oscillator is easily reduced, and the oscillator is easily assembled.

5 Claims, 10 Drawing Sheets

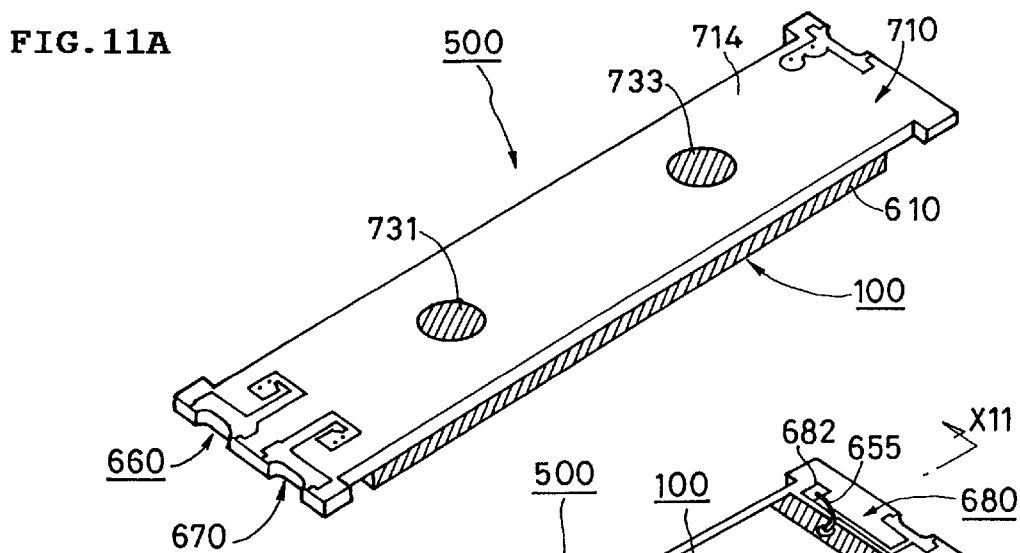
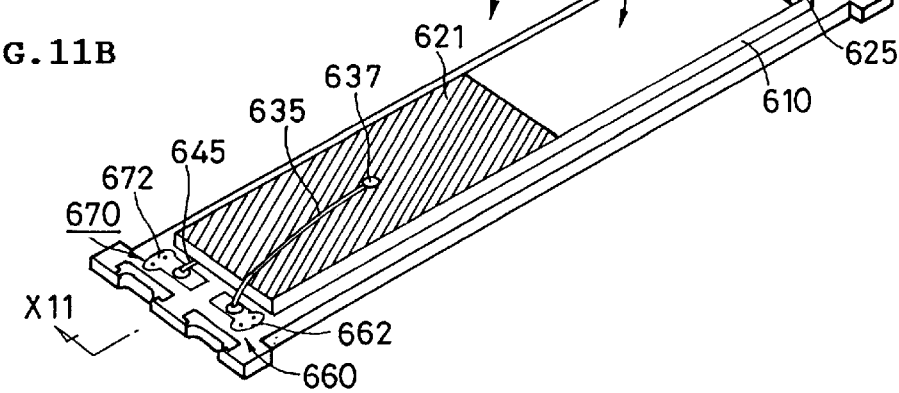
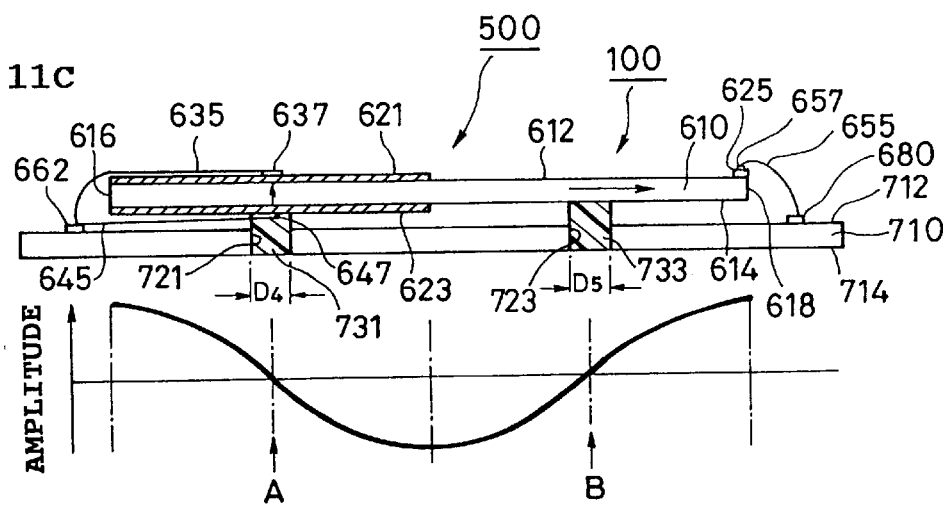

PIEZOELECTRIC OSCILLATOR COMPONENT, STRUCTURE FOR SUPPORTING PIEZOELECTRIC OSCILLATOR AND METHOD OF MOUNTING PIEZOELECTRIC OSCILLATOR

This application is the national phase under 35 U.S.C. §371 of prior PCT International Application No. PCT/JP96/02350 which has an International filing date of Aug. 22, 1996 which designated the United States of America, the entire contents of which are hereby incorporated by reference.

TECHNICAL FILED

The present invention relates to a piezoelectric oscillator component, a structure for supporting a piezoelectric oscillator and a method of mounting a piezoelectric oscillator, and more particularly, to a piezoelectric transformer component, a structure for supporting a piezoelectric transformer and a method of mounting a piezoelectric transformer.

BACKGROUND ART

Reductions in size and power consumption are required of portable devices equipped with liquid crystal displays (hereinafter refereed to as LCD) panels such as notebook type personal computers. A cold cathode fluorescent lamp (hereinafter referred to as CFL) which is widely used as a backlight for an LCD panel requires a high voltage of not less than 1 kV to initiate lighting and a high voltage of several hundred volts while it is continuously lit. As a transformer to be used therefor, attentions have been paid to a piezoelectric transformer which is small in size and can exhibit a high efficiency, and attempts have been made to develop such transformers for putting them into practical use.

However, a conventionally proposed mounting method of the piezoelectric transformer is complicated, and a supporting structure for the piezoelectric transformer and the piezoelectric transformer component which have simple structures and which can easily be assembled have not yet been developed.

It is, therefore, a main object of the present invention to provide a piezoelectric oscillator component which has a simple structure and which can easily be assembled, a structure for supporting the piezoelectric oscillator and a method of mounting the piezoelectric oscillator.

In addition to the above object, it is another object of the present invention to provide a piezoelectric oscillator component having high impact resistance and high reliability, a structure for supporting the piezoelectric oscillator and a method of mounting the piezoelectric oscillator.

It is still another object of the present invention to provide a piezoelectric oscillator component having a small size in its widthwise direction, and a method of manufacturing the same.

DISCLOSURE OF THE INVENTION

According to the present invention, there is provided a structure for supporting a piezoelectric oscillator, characterized in that at least one electrode disposed on a surface of a piezoelectric oscillator element and at least one conductive member of a wiring substrate are electrically and mechanically connected to each other by a lead terminal or lead terminals made of a conductive elastic material, thereby electrically connecting said electrode or electrodes of said piezoelectric oscillator element and said conductive member or members of said wiring substrate by said lead terminal or terminals, and supporting said piezoelectric oscillator element by said lead terminal or terminals such that said piezoelectric oscillator element does not contact said wiring substrate.

In this way, since the electrode or electrodes on the surface of the piezoelectric oscillator element and the conductive member or members of the wiring substrate are electrically and mechanically connected to each other by the lead terminal or terminals made of conductive elastic material, the lead terminal can establish both the electrical and mechanical connections. As a result, the structure is simplified, and is easily made thinner.

In this structure for supporting a piezoelectric oscillator, preferably, said surface, which includes said at least one electrode, of said piezoelectric oscillator element is opposed to said wiring substrate, one end of said lead terminal or one ends of said lead terminals are connected to said electrode or electrodes at a predetermined connecting position or predetermined portions, the other end of said lead terminal or the other ends of said lead terminals are connected to the conductive member or members of said wiring substrate, and a buffer member or buffer members for covering said lead terminal or terminals in the vicinity of said connecting position or portions are provided.

Also in this case, since the electrode or electrodes on the surface of the piezoelectric oscillator element and the conductive member or members of the wiring substrate are connected to each other by the lead terminal or terminals made of conductive elastic material, the lead terminal can establish both the electrical and mechanical connections. As a result, the structure is simplified, and is easily made thinner. Further, because the buffer member or members for covering the lead terminal or terminals in the vicinity of the connecting position or positions are provided, it is possible to disperse stress concentration on the piezoelectric oscillator element at a portion at which an edge portion of the lead terminal contacts the piezoelectric oscillator element and as a result, a higher drop impact resistance strength can be obtained. In this case, it is preferable to use an elastic adhesive as the buffer agent, and to join the piezoelectric oscillator element and the wiring substrate together by the buffer agent at least at a position or positions corresponding to the connecting position or positions. Further, a silicone rubber is preferably used as the elastic adhesive.

Further, in the above-mentioned structure for supporting a piezoelectric oscillator, preferably, said surface, which includes said at least one electrode, of said piezoelectric oscillator element is opposed to said wiring substrate, one end of said lead terminal or one ends of said lead terminals are connected to said electrode or electrodes at a predetermined connecting position or predetermined portions, the other end of said lead terminal or the other ends of said lead terminals are connected to the conductive member or members of said wiring substrate, and a buffer member or buffer members are provided between said lead terminal or terminals and said wiring substrate at least at a position or positions corresponding to said connecting position or portions.

Also in this case, since the electrode or electrodes on the surface of the piezoelectric oscillator element and the conductive member or members of the wiring substrate are connected to each other by the lead terminal or terminals made of conductive elastic material, the lead terminal can establish both the electrical and mechanical connections. As a result, the structure is simplified, and is easily made thinner. Further, since the buffer member or members are provided between the lead terminal or terminals and the wiring substrate at a position or portions corresponding to the connecting position or positions, it is possible to buffer an impact generated between the lead terminal or terminals and the wiring substrate, and a reliable supporting structure for the piezoelectric oscillator can be obtained.

Further, an elastic adhesive is preferably used as the buffer member or members, and a silicone rubber is more preferably used as the elastic adhesive.

Still futhermore, in the above-mentioned structure for supporting a piezoelectric oscillator, preferably, said surface, which includes said at least one electrode, of said piezoelectric oscillator element is opposed to said wiring substrate, one end of said lead terminal or one ends of said lead terminals are connected to said electrode or electrodes at a predetermined connecting position or predetermined portions, the other end of said lead terminal or the other ends of said lead terminals are connected to the conductive member or members of said wiring substrate, and said piezoelectric oscillator element and said wiring substrate are joined together by a buffer member or buffer members made of an elastic adhesive at least at a position or positions corresponding to said connecting position or positions.

By thus joining the piezoelectric oscillator element and the wiring substrate together by the buffer member or members made of elastic adhesive, a reliability of supporting and fixing the piezoelectric oscillator element to the wiring substrate is enhanced. Further, since a conductive elastic material is used as the lead terminal, the piezoelectric oscillator element is supported and fixed to the wiring substrate by both the elastic adhesive and the lead terminal made of elastic material and therefore, a reliability of the supporting and fixing is further enhanced. A silicone rubber is preferably used as the elastic adhesive. The piezoelectric oscillator element can be fixed only by the elastic adhesive. In this case, since the lead terminal does not require rigidity, a soft fine wire can be used, which reduces an influence on piezoelectric vibration.

Preferably, a through-hole or through-holes are provided at a portion or portions of the wiring substrate corresponding to the connecting position or positions, and the buffer member or members are charged into the through-hole or through-holes. By doing so, the buffer member or members are held to the wiring substrate more reliably. Further, by providing the through-hole or through-holes in the wiring substrate, the buffer member or members can be injected through the through-hole or through-holes, which simplifies the manufacturing method.

Further, a hole may be provided in the wiring substrate, and at least a portion of the piezoelectric oscillator element may be accommodated in the hole, which can further reduce the thickness.

Preferably, the above-mentioned lead terminal is a ribbon-like conductive thin band. Using the ribbon-like thin band, an increase in thickness due to employment of the lead terminal can be suppressed, and it becomes easy to reduce the thickness. As the ribbon-like conductive thin band, a lead frame is preferably used.

Further, preferably, at least one connecting portion of the connecting portions between said lead terminals and said electrodes of said piezoelectric oscillator element is a node or nodes of said piezoelectric oscillator element.

If the connecting portion or portions of the lead terminal are the node or nodes of vibration of the piezoelectric oscillator element, the lead terminal or terminals can be electrically and mechanically connected to the piezoelectric oscillator element without hindering the vibration of the piezoelectric oscillator, and it is possible to stably support the piezoelectric oscillator element with a simple structure without deteriorating the characteristics of the piezoelectric oscillator.

Further, preferably, of the connecting portions between the lead terminals and the electrodes of the piezoelectric oscillator element, the connecting portion or portions at which the buffer member or members are provided are the node or nodes of vibration of the piezoelectric oscillator element.

If the connecting portion or portions at which the buffer member or members are provided are the node or nodes of vibration of the piezoelectric oscillator element, the buffer member or members can be provided without lowering the resonance characteristics of the piezoelectric oscillator.

Further, the above-mentioned supporting structure for the piezoelectric oscillator is especially preferably used when the piezoelectric oscillator is a piezoelectric transformer.

According to the present invention, there is provided a piezoelectric oscillator component including a piezoelectric oscillator element, characterized in that said piezoelectric oscillator component further comprises a wiring substrate on which said piezoelectric oscillator element is mounted, and an external connecting terminal or external connecting terminals of said piezoelectric oscillator component, said piezoelectric oscillator element is mounted on said wiring substrate utilizing a lead terminal or lead terminals made of a conductive elastic material, said wiring substrate is fitted with or provided with said external connecting terminal or terminals, and said piezoelectric oscillator element and said external connecting terminal or terminals are electrically connected to each other through a conductive member or conductive members of said wiring substrate.

In this way, the external connecting terminal or terminals are not directly attached to the piezoelectric oscillator element, but the piezoelectric oscillator element is mounted on the wiring substrate, this wiring substrate is fitted with or provided with the external connecting terminal or terminals, and the piezoelectric oscillator element and the external connecting terminal or terminals are connected to each other through the conductive member or members of the wiring substrate, thereby making the external connecting terminal or terminals and the connection between the piezoelectric oscillator element and the wiring substrate independent of each other. As a result, even if a large force is applied to the external connecting terminal or terminals when the piezoelectric transformer component is mounted, no force is applied to the connection between the piezoelectric oscillator element and the wiring substrate and to the piezoelectric oscillator element itself. Therefore, the surface mounting of the piezoelectric oscillator component can easily be achieved without deteriorating performance of the piezoelectric oscillator component.

Further, since the electrode or electrodes on the surface of the piezoelectric oscillator element and the conductive member or members of the wiring substrate are electrically and mechanically connected to each other by the lead terminal or terminals made of conductive elastic material, the lead terminal can establish both the electrical and mechanical connections. As a result, the structure is simplified, and is easily made thinner.

In the present specification, the conductive member of the wiring substrate includes a land, and furthermore, if, for example, the piezoelectric oscillator element is connected to a first land through a lead terminal, and the external connecting terminal is connected to a second land, and these first and second lands are connected to each other by a wiring or a through-hole, such a conductive member having the first and second lands, the wiring and the through-hole is also included in the conductive member as defined in the present specification.

In this piezoelectric oscillator component, preferably, at least one electrode disposed on said surface of said piezoelectric oscillator element and at least one conductive member of said wiring substrate are electrically and mechanically connected to each other by said lead terminal or lead terminals, thereby electrically connecting said electrode or electrodes of said piezoelectric oscillator element and said conductive member or members of said wiring substrate by said lead terminal or terminals, and supporting said piezoelectric oscillator element by said lead terminal or terminals such that said piezoelectric oscillator element does not contact said wiring substrate.

Further, in the above-mentioned piezoelectric oscillator component, preferably, said surface, which includes said at least one electrode, of said piezoelectric oscillator element is opposed to said wiring substrate, one end of said lead terminal or one ends of said lead terminals are connected to said electrode or electrodes at a predetermined connecting position or predetermined portions, the other end of said lead terminal or the other ends of said lead terminals are connected to the conductive member or members of said wiring substrate, and a buffer member or buffer members for covering said lead terminal or terminals in the vicinity of said connecting position or portions are provided.

Also in this case, since the electrode or electrodes on the surface of the piezoelectric oscillator element and the conductive member or members of the wiring substrate are connected to each other by the lead terminal or terminals made of conductive elastic material, the lead terminal can establish both the electrical and mechanical connections. As a result, the structure is simplified, and is easily made thinner. Further, because the buffer member or members for covering the lead terminal or terminals in the vicinity of the connecting position or positions are provided, it is possible to disperse stress concentration on the piezoelectric oscillator element at a portion at which an edge portion of the lead terminal contacts the piezoelectric oscillator element and as a result, a higher drop impact resistance strength can be obtained. In this case, it is more preferable to use an elastic adhesive as the buffer agent, and to join the piezoelectric oscillator element and the wiring substrate together by the buffer agent at least at a position or positions corresponding to the connecting position or positions.

Still furthermore, in the above-mentioned piezoelectric oscillator, said surface, which includes at least one electrode, of said piezoelectric oscillator element is opposed to said wiring substrate, one end of said lead terminal or one ends of said terminals are connected to said electrode or electrodes at a predetermined connecting position or predetermined portions, the other end of said lead terminal or the other ends of said lead terminals are connected to the conductive member or members of said wiring substrate, and a buffer member or members are provided between said lead terminal or terminals and said wiring substrate at least at a position or positions corresponding to said connecting position or portions.

Also in this case, since the electrode or electrodes of the piezoelectric oscillator element and the land or lands of the wiring substrate are connected to each other by the lead terminal or terminals made of conductive elastic material, the lead terminal can establish both the electrical and mechanical connections. As a result, the structure is simplified, and is easily made thinner. Further, since the buffer member or members are provided between the lead terminal or terminals and the wiring substrate at a position or portions corresponding to the connecting position or positions, it is possible to buffer an impact generated between the lead terminal or terminals and the wiring substrate, and a reliable supporting structure for the piezoelectric oscillator can be obtained.

Further, an elastic adhesive is preferably used as the buffer member or members, and silicone rubber is more preferably used as the elastic adhesive.

Still furthermore, in the above-mentioned piezoelectric oscillator component, said surface, which includes said at least one electrode, of said piezoelectric oscillator element is opposed to said wiring substrate, one end of said lead terminal or one ends of said lead terminals are connected to said electrode or electrodes at a predetermined connecting position or predetermined portions, the other end of said lead terminal or the other ends of said lead terminals are connected to the conductive member or members of said wiring substrate, and said piezoelectric oscillator element and said wiring substrate are joined together by a buffer member or buffer members made of an elastic adhesive at least at a position or positions corresponding to said connecting position or positions.

By thus joining the piezoelectric oscillator element and the wiring substrate together by the buffer member or members made of elastic adhesive, a reliability of supporting and fixing the piezoelectric oscillator element to the wiring substrate is enhanced, resulting in further enhancing a reliability of the piezoelectric oscillator component. Further, since a conductive elastic material is used as the lead terminal, the piezoelectric oscillator element is supported and fixed to the wiring substrate by both the elastic adhesive and the lead terminal made of elastic material and therefore, a reliability of the supporting and fixing is enhanced, resulting in further enhancing a reliability of the piezoelectric oscillator component. Also in this piezoelectric oscillator component, the piezoelectric oscillator element can be fixed only by the elastic adhesive. In that case, a soft fine wire can be used, which reduces an influence on piezoelectric vibration. A silicone rubber is preferably used as the elastic adhesive.

Further, also in the piezoelectric oscillator component of the present invention, preferably, a through-hole or through-holes are provided at a portion or portions of said wiring substrate corresponding to said connecting portion or portions, and said buffer member or members are charged into said through-hole or through-holes.

In the piezoelectric oscillator component of the present invention, preferably, said lead terminal is a ribbon-like conductive thin band.

In the piezoelectric oscillator component of the present invention, preferably, at least one connecting portion of the connecting portions between the lead terminals and the electrodes of said piezoelectric oscillator element is a node or nodes of said piezoelectric oscillator element.

In the piezoelectric oscillator component of the present invention, preferably, of the connecting portions between said lead terminals and said electrodes of said piezoelectric oscillator element, the connecting portion or portions, at which said buffer member or members are provided, are a node or nodes of said piezoelectric oscillator element.

Preferably, a case for covering the piezoelectric oscillator element and the lead terminal or terminals is fitted to the wiring substrate. If the piezoelectric oscillator element and the lead terminal or terminals are covered with the case, the piezoelectric oscillator element and the lead terminal or terminals can be protected by the case, and the surface mounting of the piezoelectric oscillator component can easily be achieved without deteriorating the performance of the piezoelectric oscillator component.

Further, the above-mentioned piezoelectric oscillator component is especially preferably used when the piezoelectric oscillator is a piezoelectric transformer.

According to the present invention, there is provided a method of mounting a piezoelectric oscillator, characterized by comprising the steps of:

opposing a surface, which has at least one electrode, of a piezoelectric oscillator element to one main face of a wiring substrate, to connect one end or ends of a lead terminal or lead terminals made of a conductive elastic material to said electrode or electrodes at a predetermined connecting position or predetermined connecting portions, and to connect the other end or ends of said lead terminal or terminals to a conductive member or conductive members of said wiring substrate; and injecting a buffer material from the other main face, which is opposite to said one main face, of said wiring substrate through a through-hole or through-holes provided in a portion or portions, which correspond to said connecting position or portions, of said wiring substrate corresponding, to provide said buffer material between said lead terminal or terminals and said wiring substrate at least at a position or positions corresponding to said connecting position or positions.

Preferably, said step of providing said buffer material between said lead terminal or terminals and said wiring substrate is a step of providing said buffer material between said lead terminal or terminals and said wiring substrate at least at a position or positions corresponding to said connecting position or portions, and covering said lead terminal or terminals in the vicinity of said connecting position or portions by said buffer material.

Preferably, said buffer material is an elastic adhesive, and said step of providing said buffer material between said lead terminal or terminals and said wiring substrate is a step of providing said buffer material between said lead terminal or terminals and said wiring substrate at least at a position or positions corresponding to said connecting position or portions, and joining said piezoelectric oscillator element and said wiring substrate by said buffer material.

By thus injecting the buffer material made of elastic adhesive from the other main face opposite to the one main face of the wiring substrate through the through-hole or through-holes provided in the wiring substrate, the buffer material can be easily injected and as a result, the manufacturing method is simplified.

Further, the above-mentioned method of mounting a piezoelectric oscillator is especially preferably used when the piezoelectric oscillator is a piezoelectric transformer.

In the above description, the position corresponding to the connecting position means a region from a position which is opposed to said connecting position of the wiring substrate to said connecting position.

The lead terminal made of conductive elastic material is preferably made of metal material, and is more preferably, made of a phosphor bronze or an iron-nickel 4-2 alloy.

According to the present invention, there is provided a piezoelectric transformer component including a piezoelectric oscillator element, characterized in that said piezoelectric transformer component further comprises a mounting substrate on which said piezoelectric oscillator element is mounted, and an external connecting terminal or external connecting terminals of said piezoelectric oscillator component, said piezoelectric oscillator element is mounted on said mounting substrate, said mounting substrate is fitted with or provided with said external connecting terminal or terminals, and said piezoelectric oscillator element and said external connecting terminal or terminals are electrically connected to each other through a conductive member or conductive members of said mounting substrate.

In this way, as described above, the external connecting terminal and the connection between the piezoelectric oscillator element and the wiring substrate are made to be independent of each other. As a result, even if a large force is applied to the external connecting terminal or terminals when the piezoelectric transformer component is mounted, no force is applied to the connection between the piezoelectric oscillator element and the wiring substrate and to the piezoelectric oscillator element itself. Therefore, the surface mounting of the piezoelectric oscillator component can be easily achieved without deteriorating performance of the piezoelectric oscillator component. By disposing the external terminal at the longitudinal end of the mounting substrate, it is possible to reduce the width of the piezoelectric transformer component.

In this piezoelectric transformer component, preferably, said piezoelectric oscillator element and said mounting substrate are joined together through an elastic body or elastic bodies on the center line of said piezoelectric oscillator element in the widthwise direction thereof and at one or more positions out of positions of 1/n (n is an integer equal to or greater than 2) of the length of said piezoelectric oscillator element in the longitudinal direction thereof times m (m is an integer smaller than n).

Further, in this piezoelectric transformer component, preferably, said piezoelectric oscillator element and said mounting substrate are joined together through an elastic body or elastic bodies at one or more positions out of positions corresponding to nodes of vibration of said piezoelectric oscillator element.

The nodes of vibration of the piezoelectric oscillator element in widthwise direction thereof are located on the center line in the widthwise direction of the piezoelectric oscillator element. Further, positions of 1/n (n is an integer equal to or greater than 2) of the length of the piezoelectric oscillator element in the longitudinal direction thereof times m (m is an integer smaller than n) are positions of the nodes of vibration in the longitudinal direction. Therefore, the piezoelectric oscillator element is joined to the mounting substrate at the node or nodes of vibration.

The node or nodes of vibration of the piezoelectric oscillator element is supported by the elastic body or bodies in this way, the hindrance to vibration is suppressed. Further, since the piezoelectric oscillator element is supported by the elastic body or bodies, a lead wire for leading out from an electrode need not support the piezoelectric oscillator element, and therefore the lead wire does not require rigidity, and the wiring can be freely be achieved. Therefore, when a lead terminal having rigidity is utilized, the lead terminal is extended out from the side of the piezoelectric oscillator element and connected to an externally leading-out-point, but in the above-described piezoelectric transformer component, the lead wire for leading out can be led only in the longitudinal direction of the piezoelectric oscillator element. As a result, a widthwise size of the piezoelectric transformer component can be reduced to about the width of the piezoelectric oscillator element, a space in a liquid crystal display panel in the widthwise direction of the piezoelectric transformer component can be made smaller and as a result, a liquid crystal display portion can be made larger without increasing a width of the liquid crystal display panel.

Although the number of positions to be joined is preferably two or more, the number may be three or more. For example, when frequency at the primary input side is set such that vibration of 1.5 wavelength is generated in the longitudinal direction, of three positions where n is 6, and m is 1, 3 or 5, appropriate two positions or all of the three positions correspond to the connecting positions. Further, in the case of 2 wavelength, of four positions where n is 8 and m is 1, 3, 5 or 7, the connections are made at a combination of appropriate two of the four positions, a combination of appropriate three of the four positions, or all of the four positions.

If the connections are made at two or more positions in this way, since the piezoelectric oscillator element can be supported only by the elastic bodies, the present invention functions more effectively.

Further, it is preferable to provide a through-hole or through-holes at a position or positions corresponding to said connecting portion or portions between said mounting substrate and said piezoelectric oscillator element. By doing so, the elastic body and bodies can be injected through this through-hole or these through-holes, the piezoelectric transformer component can be assembled easily.

Further, preferably, the above-mentioned elastic body is an elastic adhesive, and, for example, silicone rubber is preferably used as the elastic adhesive.

According to the present invention, there is provided a method of manufacturing a piezoelectric transformer component including a piezoelectric oscillator element and a mounting substrate on which said piezoelectric oscillator element is mounted, characterized by comprising the steps of:
  providing a through-hole or through-holes at a predetermined portion or predetermined portions of said mounting substrate; and
  injecting an elastic adhesive from a face of said mounting substrate, which is opposite to a face thereof on which said piezoelectric oscillator element is mounted, thereby joining said piezoelectric oscillator element and said mounting substrate together by said elastic adhesive.

Preferably, said step of providing said through-hole or through-holes at the predetermined portion or portions of said mounting substrate is a step of providing said through-hole or through-holes at the predetermined portion or portions of said mounting substrate which locate on the center line of said piezoelectric oscillator element in the widthwise direction thereof and which correspond to one or more positions out of positions of 1/n (n is an integer equal to or greater than 2) of the length of said piezoelectric oscillator element in the longitudinal direction thereof times m (m is an integer smaller than n).

Preferably, said step of providing said through-hole or through-holes at the predetermined portion or portions of said mounting substrate is a step of providing said through-hole or through-holes at the predetermined portion or portions of said mounting substrate which correspond to one or more positions out of positions corresponding to nodes of vibration of said piezoelectric oscillator element.

In this way, by thus injecting the buffer material made of elastic adhesive from the other main face opposite to the one main face of the wiring substrate through the through-hole or through-holes provided in the wiring substrate, the buffer material can be easily injected and as a result, the manufacturing method is simplified. Further, since the node or nodes of vibration of the piezoelectric oscillator element are supported by the elastic adhesive, hindrance to the vibration is suppressed, and the lead wire for leading out from an electrode need not require the rigidity, the wiring can be freely achieved, and the widthwise size of the piezoelectric transformer component is made smaller.

According to the present invention, there is provided a structure for supporting a piezoelectric oscillator element to a wiring substrate, characterized in that
  a through-hole or through-holes are provided at a predetermined portion or portions of said mounting substrate which locate on the center line of said piezoelectric oscillator element in the widthwise direction thereof and which correspond to one or more positions out of positions of 1/n (n is an integer equal to or greater than 2) of the length of said piezoelectric oscillator element in the longitudinal direction thereof times m (m is an integer smaller than n), and
  said piezoelectric oscillator element and said wiring substrate are joined together through an elastic body or bodies at said predetermined portion or portions.

According to the present invention, there is provided a structure for supporting a piezoelectric oscillator element to a wiring substrate, characterized in that
  a through-hole or through-holes are provided at a predetermined portion or portions of said mounting substrate which correspond to one or more positions out of positions corresponding to nodes of vibration of said piezoelectric oscillator element, and
  said piezoelectric oscillator element and said wiring substrate are joined together through an elastic body or bodies at said predetermined portion or portions.

By employing these structure, since the node or nodes of vibration of the piezoelectric oscillator element are connected by the elastic body or bodies, hindrance to the vibration is suppressed, and the lead wire for leading out from an electrode need not require the rigidity, and the wiring can be freely achieved. Further, the elastic body can be charged into the through-hole, and the elastic body is held in the wiring substrate more reliably. Furthermore, the elastic body can be injected through the through-hole, and the manufacturing method is simplified.

According to the present invention, there is provided a piezoelectric transformer mounting method for mounting a piezoelectric transformer element on a wiring substrate, characterized by comprising the steps of:
  providing a through-hole or through-holes at a predetermined portion or predetermined portions of said mounting substrate which locate on the center line of said piezoelectric oscillator element in the widthwise direction thereof and which correspond to one or more positions out of positions of 1/n (n is an integer equal to or greater than 2) of the length of said piezoelectric oscillator element in the longitudinal direction thereof times m (m is an integer smaller than n), and
  injecting an elastic adhesive from a face of said mounting substrate, which is opposite to a face thereof on which said piezoelectric oscillator element is mounted, thereby joining said piezoelectric oscillator element and said mounting substrate together by said elastic adhesive.

According to the present invention, a piezoelectric transformer mounting method for mounting a piezoelectric transformer element on a wiring substrate, characterized by comprising the steps of:

provoding a through-hole or through-holes at a predetermined portion or portions of said mounting substrate which correspond to one or more positions out of positions corresponding to nodes of vibration of said piezoelectric oscillator element, and injecting an elastic adhesive from a face of said mounting substrate, which is opposite to a face thereof on which said piezoelectric oscillator element is mounted, thereby joining said piezoelectric oscillator element and said mounting substrate together by said elastic adhesive.

In these methods, since the node or nodes of vibration of the piezoelectric oscillator element are supported by the elastic adhesive, hindrance to the vibration is suppressed. Further, by thus injecting the buffer material made of elastic adhesive from the other main face opposite to the one main face of the wiring substrate through the through-hole or through-holes, the buffer material can be easily injected and as a result, the manufacturing method is simplified.

In the above, the wiring substrate means one which supports a piezoelectric oscillator element constituting, e.g., a piezoelectric transformer to constitute a piezoelectric transformer component or a piezoelectric oscillator component which is a discrete component, or one, such as a printed-wiring board, on which a piezoelectric oscillator element, a piezoelectric transformer component or a piezoelectric oscillator component, and other circuit component are mounted.

BRIEF DESCRIPTION OF THE DRAWINGS

FIGS. 11A and 11B are perspective views of a piezoelectric transformer component 500 as viewing from the back side and front side, respectively, for explaining a seventh embodiment of the present invention;

FIG. 11C is a longitudinal cross-sectional view taken along the line X11—X11 in FIG. 11B; and FIG. 11D is a diagram showing amplitude distribution of a piezoelectric oscillator element 100 used in the seventh embodiment of the present invention;

EMBODIMENTS

Figure 1A:
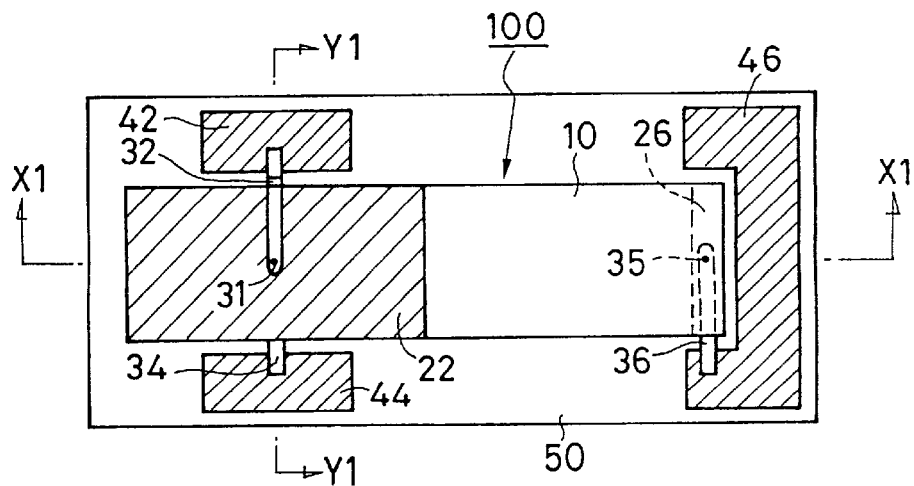
FIG. 1A is a plan view for explaining a first embodiment of the present invention.
Figure 1B:
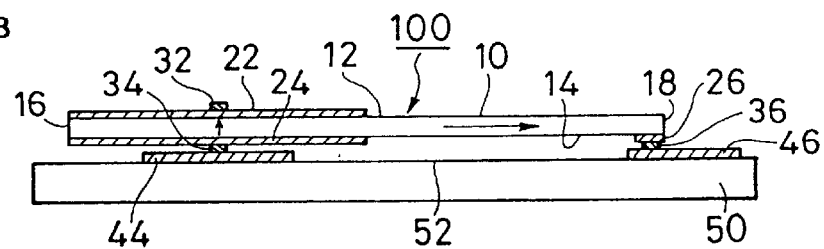
FIG. 1B is a longitudinal cross-sectional view taken along the line X1—X1 in FIG. 1A.

Next, embodiments of the present invention will be explained with reference to the drawings.

First Embodiment

Referring to FIGS. 1A to 1D, a piezoelectric oscillator element 100 constituting a piezoelectric transformer is mounted on a printed wiring board 50. The piezoelectric oscillator element 100 includes a rectangular parallelepipedic piezoelectric ceramics substrate 10, a primary-side electrode 22 is disposed on the top face 12 of the piezoelectric ceramics substrate 10 to cover the left (primary) half thereof, and a primary-side electrode 24 is disposed on the bottom face 14 of the piezoelectric ceramics substrate 10 opposite to the primary-side electrode 22, and the portion of the piezoelectric ceramics substrate 10 between the primary-side electrode 22 and the primary-side electrode 24 is polarized in the thicknesswise direction between the top face 12 and the bottom face 14. A secondary-side electrode 26 is disposed on the bottom face 14 in the vicinity of the secondary-side end surface 18, and the portion of the piezoelectric ceramics substrate 10 between the primary-side electrodes 22, 24 and the secondary-side electrode 26 is polarized in the Longitudinal direction which is the extending direction of the top face 12 and the bottom face 14.

When a voltage is applied between the primary-side electrode 22 and the primary-side electrode 24, an electric field is applied to the left half in the thicknesswise direction, which excites longitudinal vibration in the longitudinal direction due to a piezoelectric transverse effect involving a displacement perpendicular to the direction of polarization, whereby a piezoelectric transformer element 100 vibrates as a whole. Further, on the right half, a mechanical distortion is generated in the longitudinal direction, a voltage having the same frequency as the primary voltage which is applied between the primary-side electrodes 22 and 24 is output from the secondary-side electrode 26 due to a piezoelectric longitudinal effect generating potential difference in the direction of polarization. When a driving voltage having a frequency equal to a resonant frequency of the piezoelectric oscillator element 100 is applied between the primary-side electrodes 22 and 24, the extremely high set-up ratio can be obtained.

Figure 1C:
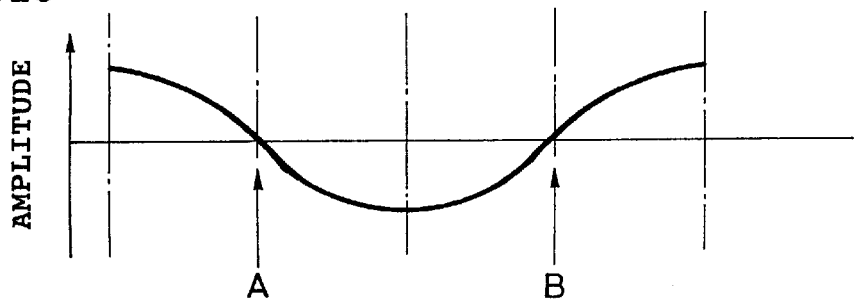
FIG. 1C is a diagram showing amplitude distribution of a piezoelectric oscillator element 100 used in the first embodiment of the present invention.
Figure 1D:
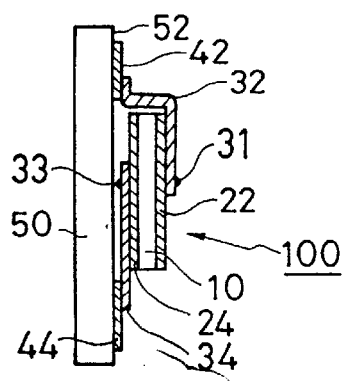
FIG. 1D is a longitudinal cross-sectional view taken along the line Y1—Y1 in FIG. 1A.

The piezoelectric oscillator element 100 of the present embodiment can be driven in such a resonance mode that one wavelength of stress distribution exists between the primary-side end surface 16 and the secondary-side end surface 18, for example. If a voltage having a frequency equal to a resonant frequency of the one wavelength type resonance mode is applied between the primary-side electrodes 22 and 24, since the primary-side end surface 16 and the secondary-side end surface 18 of the piezoelectric ceramics substrate 10 are both open, at both longitudinal ends of the piezoelectric ceramics substrate 10, stress is zero and amplitude is maximized. Also, since the piezoelectric ceramics substrate 10 is resonated in the one wavelength mode, amplitude distributions are as shown in FIG. 1C, and nodes of vibration appear at a position (node A) located ¼ of the length of the piezoelectric ceramics substrate 10 as measured from the primary-side end surface 16 of the piezoelectric ceramics substrate 10, and at a position (node B) located ¾ of the length of the piezoelectric ceramics substrate 10 as measured from the primary-side end surface 16 of the piezoelectric ceramics substrate 10.

Lands 42, 44 and 46 of copper foils are disposed on the top face 52 of a printed wiring board 50.

The piezoelectric oscillator element 100 is supported by lead frames 32, 34 and 36. A portion of the lead frame 32 in the vicinity of its one end is connected to and fixed to the primary-side electrode 22 at a connecting portion 31 by welding, and the other end of the lead frame 32 is connected to and fixed to the land 42 by soldering or the like. A portion of the lead frame 34 in the vicinity of its one end is connected to and fixed to the primary-side electrode 24 at a connecting portion 33 by welding, and the other end of the lead frame 34 is connected to and fixed to the land 44 by soldering or the like. A portion of the lead frame 36 in the vicinity of its one end is connected to and fixed to the secondary-side electrode 26 at a connecting portion 35 by welding, and the other end of the lead frame 36 is connected to and fixed to the land 46 by soldering or the like. The lead frames 34 and 36 connected to and fixed to the bottom face 14 of the piezoelectric ceramics substrate 10 are straight in shapes, and the lead frame 32 connected to and fixed to the top face 12 of the piezoelectric ceramics substrate 10 is upwardly bent at its intermediate portion.

The connecting portions 31 and 33 are located ¼ of the length of the piezoelectric ceramics substrate 10 as measured from the primary-side end surface 16, and located at the center position in the widthwise direction of the piezoelectric ceramics substrate 10 which is perpendicular to the longitudinal direction thereof. The connecting portion 35 is located at the center of the piezoelectric ceramics substrate 10 in the widthwise direction thereof and in the vicinity of the secondary-side end surface 18 of the piezoelectric ceramics substrate 10.

In the present embodiment, the primary-side electrodes 22 and 24 are electrically and mechanically connected to the lands 42 and 44 by the lead frames 32 and 34, respectively, and the secondary-side electrode 26 is electrically and mechanically connected to the land 46. Therefore, the structure is simplified and can be easily made thinner.

Further, the connecting portion 31 between the primary-side electrode 22 and the lead frame 32, and the connecting portion 33 between the primary-side electrode 24 and the lead frame 34 are positioned at the vibration node A, and the lead frames 32, 34 and 36 are thin and exhibit excellent spring properties. Therefore, it is possible to reduce hindrance to vibration of the piezoelectric oscillator element 10 which occurs by the electrical connection with the piezoelectric oscillator element 100 or by supporting the piezoelectric oscillator element 100.

In the present embodiment, since the piezoelectric oscillator element 100 can be supported by the lead frames 34 and 32 made of elastic material, a lead wire can be used instead of the lead frame 36. By doing so, since the piezoelectric oscillator element 100 can be supported only by the lead frame connected to the vibration node, it is possible to further reduce hindrance to vibration.

Second Embodiment

Figure 2:
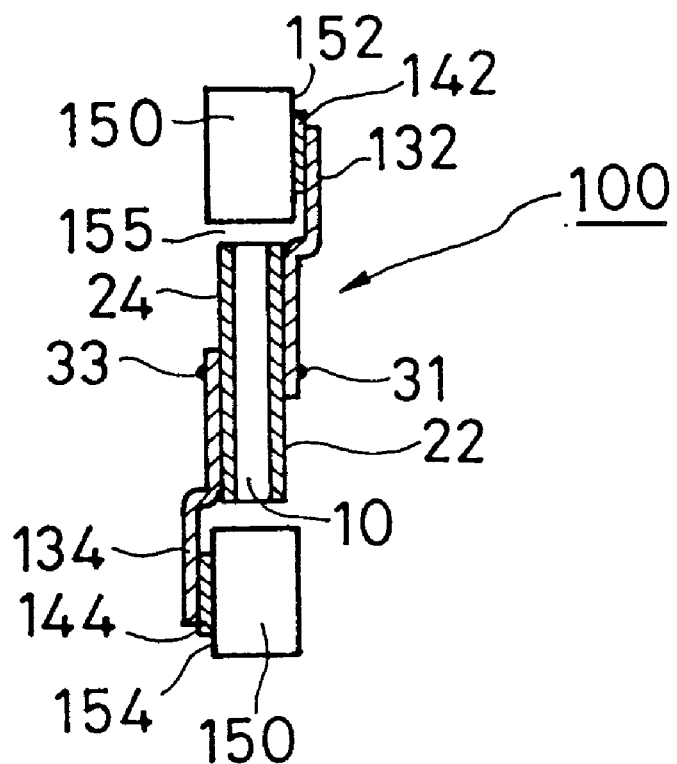
FIG. 2 is a plan view for explaining a second embodiment of the present invention.

Although the piezoelectric oscillator element 100 is disposed on the top face of the printed wiring board 50 in the above-described first embodiment, a second embodiment is different, as shown in FIG. 2, from the first embodiment in that a printed wiring board 150 is formed at its center portion with a hole 155 in which the piezoelectric oscillator element 100 constituting a piezoelectric transformer can be accommodated, and the piezoelectric oscillator element 100 is accommodated in the hole 155, and in that a lead frame 132, which is connected at its one end with the primary-side electrode 22 at the connecting point 31 by welding, is connected at its other end with a land 142 on the top face 152 of the printed wiring board 150 by soldering or the like, and a lead frame 134, which is connected at its one end with the primary-side electrode 24 at the connecting point 33 by welding, is connected at its other end with a land 144 on the bottom face 154 of the printed wiring board 150 by soldering or the like, but other points are the same.

Also in the present embodiment, the primary-side electrodes 22 and 24 are electrically and mechanically connected to the lands 142 and 144 by the lead frames 132 and 134 made of elastic material. Therefore, the structure is simplified and can be easily made thinner. In the present embodiment, especially, because the piezoelectric oscillator element 100 is accommodated in the hole 155 of the printed wiring board 150, the structure can be made remarkably thinner.

Further, the connecting portion 31 between the primary-side electrode 22 and the lead frame 132, and the connecting portion 33 between the primary-side electrode 24 and the lead frame 134 are positioned at the vibration node A, and the lead frames 132 and 134 are thin and exhibit excellent spring properties. Therefore, it is possible to reduce hindrance to vibration of the piezoelectric oscillator element 100 which occurs by the electrical connection with the piezoelectric oscillator element 100 or by supporting the piezoelectric oscillator element 100.

The structure of the present embodiment can also be applied to a case where the piezoelectric oscillator element 100 is the piezoelectric oscillator element 100 shown in FIGS. 3A, 3B, 6A and 6C.

Third Embodiment

Figure 3A:
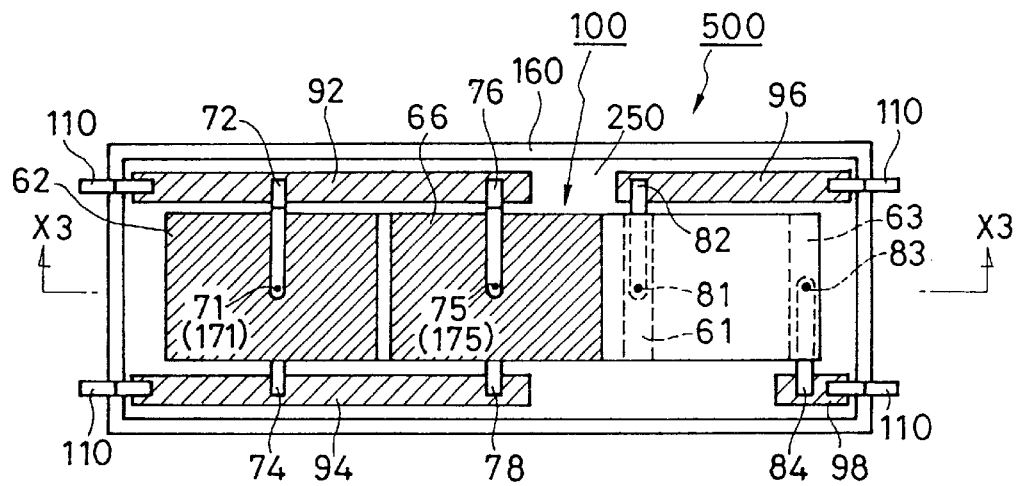
FIG. 3A is a transverse cross-sectional view taken along the line Z3—Z3 in FIG. 3C for explaining a third embodiment of the present invention.
Figure 3B:
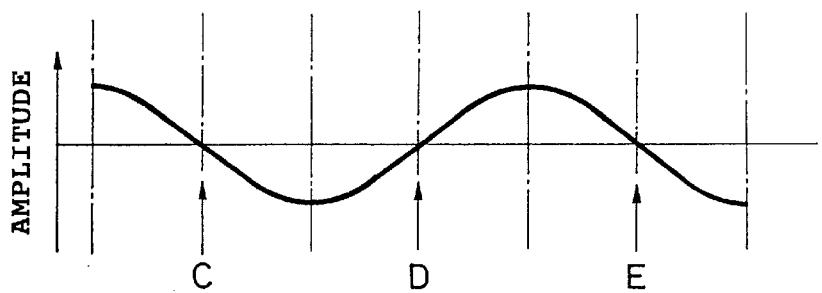
FIG. 3B is a diagram showing amplitude distribution of a piezoelectric oscillator element 100 used in the second embodiment of the present invention.
Figure 3C:
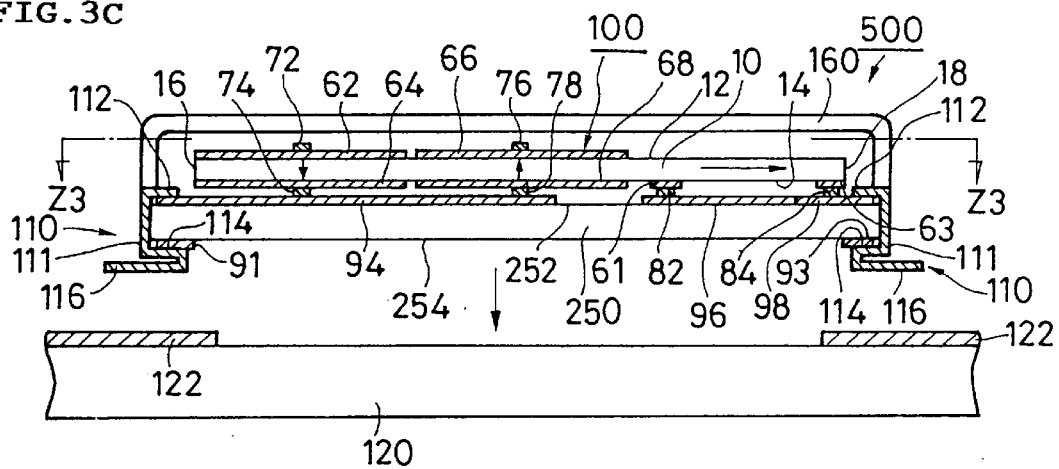
FIG. 3C is a longitudinal cross-sectional view taken along the line X3—X3 in FIG. 3A.

Referring to FIGS. 3A to 3C, a piezoelectric oscillator element 100 constituting a piezoelectric transformer is disposed on a top face 252 of a wiring substrate 250, the piezoelectric oscillator element 100 is connected to lands 92, 94, 96 and 98 of a wiring substrate by lead frames 72, 74, 76, 78, 82 and 84, and a case 160 for covering the piezoelectric oscillator element 100, the lead frames 72, 74, 76, 78, 82 and 84, and the lands 92, 94, 96 and 98 is mounted on a peripheral edge of the wiring substrate 250. The lands 92, 94, 96 and 98 are made of copper foil. External connecting terminals 110 respectively connected to the lands 92, 94, 96 and 98 are mounted to the case 160 such as to project outward. In this way, by constituting a piezoelectric transformer component 500 by the wiring substrate 250, the piezoelectric oscillator element 100, the lead frames 72, 74, 76, 78, 82 and 84, and the external connecting terminals 110, and by connecting the external connecting terminals 110 to a wiring pattern 122 on the printed wiring board 120 by soldering, the piezoelectric transformer component 500 is electrically and mechanically connected to the printed wiring board 120.

A primary-side electrode 62 is disposed on the top face 12 of the rectangular parallelepipedic piezoelectric ceramics substrate 10 to cover the left ⅓ thereof, and a primary-side electrode 64 is also disposed on the bottom face 14 of the piezoelectric ceramics substrate 10 opposite to the primary-side electrode 62, and the portion of the piezoelectric ceramics substrate 10 between the primary-side electrode 62 and the primary-side electrode 64 is polarized in the thicknesswise direction between the top face 12 and the bottom face 14.

A primary-side electrode 66 is disposed on the top face 12 of the piezoelectric ceramics substrate 10 such that the primary-side electrode 66 extends in the longitudinal direction of the piezoelectric ceramics substrate 10 from a position located ⅓ of the longitudinal length of the piezoelectric ceramics substrate 10 as measured from the primary-side end surface 16 thereof to a position located ⅔ of the longitudinal length of the piezoelectric ceramics substrate 10 as measured from the primary-side end surface 16, and also a primary-side electrode 68 is disposed on the bottom face 14 of the piezoelectric ceramics substrate 10 opposite to the primary-side electrode 66. The primary-side electrode 66 is disposed in separation from the primary-side electrode 62, and the primary-side electrode 68 is disposed in separation from the primary-side electrode 64. The portion of the piezoelectric ceramics substrate 10 between the primary-side electrode 66 and the primary-side electrode 68 is polarized in the thicknesswise direction of the piezoelectric ceramics substrate 10 between the top face 12 and the bottom face 14. A direction of polarization in the portion of the piezoelectric ceramics substrate 10 between the primary-side electrode 62 and the primary-side electrode 64 is opposite to that in the piezoelectric ceramics substrate 10 between the primary-side electrode 66 and the primary-side electrode 68.

A secondary-side electrode 61 is disposed on the bottom face 14 in the vicinity of the primary-side electrode 68 in separation at a predetermined distance from the primary-side electrode 68 and in a region of the piezoelectric ceramics substrate 10 between the secondary-side end surface 18 and a position located ⅔ of the longitudinal length of the piezoelectric ceramics substrate 10 as measured from the primary-side end surface 16 thereof, and a secondary-side electrode 63 is disposed on the bottom face 12 in the vicinity of the secondary-side end surface 18. The portion of the piezoelectric ceramics substrate 10 between the secondary-side electrode 61 and the secondary-side electrode 63 is polarized in the longitudinal direction of the piezoelectric ceramics substrate 10.

When a voltage is applied between the primary-side electrodes 62 and 64 and the primary-side electrodes 66 and 68, an electric field is applied to the left ⅔ of the piezoelectric ceramics substrate 10 in the thicknesswise direction thereof, which excites longitudinal vibration in the longitudinal direction due to a piezoelectric transverse effect involving a displacement perpendicular to the direction of the polarization, whereby the piezoelectric oscillator element 100 vibrates as a whole. The piezoelectric oscillator element 100 according to the present embodiment can be driven in a resonance mode that 1.5 wavelength of stress distribution exists between the primary-side end surface 16 and the secondary-side end surface 18. If a voltage having a frequency equal to a resonant frequency of the 1.5 wavelength type resonance mode is applied from a power source (not shown), since the primary-side end surface 16 and the secondary-side end surface 18 of the piezoelectric ceramics substrate 10 are both open, at both longitudinal ends of the piezoelectric ceramics substrate 10, stress is zero and amplitude is maximized. Also, since the piezoelectric ceramics substrate 10 is resonated in the 1.5 wavelength mode, amplitude distributions are as shown in FIG. 3B.

When the piezoelectric oscillator element 100 is driven in such a 1.5 wavelength mode, nodes of vibration appear at three positions: namely, a position (node C) located ⅙ of the length of the piezoelectric ceramics substrate 10 as measured from the primary-side end surface 16, a position (node D) located ½ of the length of the piezoelectric ceramics substrate 10 as measured from the primary-side end surface 16, and a position (node E) located ⅚ of the length of the piezoelectric ceramics substrate 10 as measured from the primary-side end surface 16. In the present embodiment, connecting points 71 and 171 are provided at the vibration node C, and connecting points 75 and 175 are provided at the vibration node D.

In the present embodiment, in addition to the primary-side electrodes 62 and 64, the primary-side electrodes 66 and 68 are further provided. Therefore, the area of electrodes at the primary side becomes greater, and the input impedance of the piezoelectric oscillator element 100 becomes smaller accordingly. As a result, electrical energy from the power source (not shown) is more readily fed to the piezoelectric oscillator element 100.

Also, a direction of stress within that region provided with the primary-side electrodes 62 and 64 is opposite to a direction of stress within that region provided with the primary-side electrodes 66 and 68. The portion of the piezoelectric ceramics substrate 10 between the primary-side electrode 62 and the primary-side electrode 64 is polarized in opposite direction to that in the piezoelectric ceramics substrate 10 between the primary-side electrode 66 and the primary-side electrode 68, but an electric field is applied in the same direction. Accordingly, when a voltage from the power source (not shown) is applied between the primary-side electrode 66 and the primary-side electrode 68, the portion of the piezoelectric ceramics substrate 10 between the primary-side electrode 66 and the primary-side electrode 68 vibrates so as to further enhance the resonance which is excited by applying a voltage from the power source (not shown) between the primary-side electrode 62 and the primary-side electrode 64. As a result, electrical energy fed from the power source (not shown) at the primary side can be more efficiently converted to mechanical elastic energy.

Further, in the present embodiment, the secondary-side electrode 61 and the secondary-side electrode 63 are disposed in separation from each other at a predetermined distance in the longitudinal direction of the piezoelectric ceramics substrate 10 on the bottom face 14 thereof between the secondary-side end surface 18 and a position located ⅔ of the longitudinal length of the piezoelectric ceramics substrate 10 as measured from the primary-side end surface 16 thereof. Therefore, the output impedance can be varied by changing the distance between the secondary-side electrode 61 and the secondary-side electrode 63, thereby improving degrees of freedom in design.

Furthermore, since the secondary-side electrode 61 and the secondary-side electrode 63 are separated from the primary-side electrodes 62, 64, 66 and 68 in terms of direct current in this way, it is possible to separate a primary-side circuit from a secondary-side circuit in -terms of direct current. Therefore, independent ground electrodes can be formed for the respective secondary-side and primary-side circuits (for example, the primary-side electrodes 64 and 68, and the secondary-side electrode 61 can be used as separate ground electrodes which are independent of each other), to insulate the grounds of the primary side and the secondary side from each other, and also to maintain the secondary side in a floated state without grounding (for example, the secondary-side electrode 61 is floated without grounding), thereby resulting in improved noise resistance.

Lands 92, 94, 96 and 98 of copper foils are disposed on the top face 252 of a printed wiring board 250.

The piezoelectric oscillator element 100 is supported by lead frames 72, 74, 76, 78, 82 and 84. A portion of the lead frame 72 in the vicinity of its one end is connected to and fixed to the primary-side electrode 62 at a connecting portion 71 by welding, and the other end of the lead frame 72 is connected to and fixed to the land 92 by soldering or the like. Similarly, portions of the lead frames 74, 76 and 78 in the vicinity of their one end are respectively connected to and fixed to the primary-side electrodes 64, 66 and 68 respectively at connecting portions 171, 75, 175 by welding, and the other ends of the lead frames 74, 76 and 78 are connected to and fixed to the lands 94, 92 and 94 by soldering or the like respectively. Portions of the lead frames 82 and 84 in the vicinity of their one ends are respectively connected to and fixed to the secondary-side electrodes 61 and 63 respectively at connecting portions 81 and 83 by welding, and the other ends of the lead frames 82 and 84 are respectively connected to and fixed to the lands 96 and 98 by soldering or the like. The lead frames 74, 78, 82 and 84 connected to and fixed to the bottom face 14 of the piezoelectric ceramics substrate 10 are straight in shapes, and the lead frames 72 and 76 connected to and fixed to the top face 12 of the piezoelectric ceramics substrate 10 is upwardly bent at their intermediate portions.

The connecting portions 71 and 171 are located ⅙ of the length of the piezoelectric ceramics substrate 10 as measured from the primary-side end surface 16, and located at the center in the widthwise direction of the piezoelectric ceramics substrate 10 which is perpendicular to the longitudinal direction thereof. The connecting portions 75 and 175 are located ½ of the length of the piezoelectric ceramics substrate 10 as measured from the primary-side end surface 16, and located at the center in the widthwise direction of the piezoelectric ceramics substrate 10 which is perpendicular to the longitudinal direction thereof. The connecting portions 81 and 83 are also located at the center in the widthwise direction of the piezoelectric ceramics substrate 10.

In the present embodiment, the primary-side electrodes 62 and 66 are electrically and mechanically connected to the land 92 by the lead frames 72 and 76, respectively, the primary-side electrodes 64 and 68 are electrically and mechanically connected to the land 94 by the lead frames 74 and 78, respectively, the secondary-side electrode 61 is electrically and mechanically connected to the land 96 by the lead frame 82, and the secondary-side electrode 63 is electrically and mechanically connected to the land 98 by the lead frame 84. Therefore, the structure is simplified and can be easily made thinner.

Further, the connecting portion 71 between the primary-side electrode 62 and the lead frame 74, and the connecting portion 171 between the primary-side electrode 64 and the lead frame 74 are positioned at the vibration node C, the connecting portion 75 between the primary-side electrode 66 and the lead frame 76, and the connecting portion 175 between the primary-side electrode 68 and the lead frame 78 are positioned at the vibration node D, and the lead frames 72, 74, 76, 78, 82 and 84 are thin and exhibit excellent spring properties. Therefore, it is possible to reduce hindrance to vibration of the piezoelectric oscillator element 10 which occurs by the electrical connection with the piezoelectric oscillator element 100 or by supporting the piezoelectric oscillator element 100.

In the present embodiment, since the piezoelectric oscillator element 100 can be supported by the lead frames 74 and 78, lead wires can be used instead of the lead frames 82 and 84. By doing so, since the piezoelectric oscillator element 100 can be supported only by the lead frame connected to the vibration nodes, it is possible to further reduce hindrance to vibration. In FIGS. 3A and 3C, although the bottom face 14 including the second-side electrodes 61 and 63 is opposed to the wiring substrate 250, the top face 14, which is located at the opposite side, may be opposed to the wiring substrate 250. Further, lead wires can be used instead of the lead frames 72 and 76. In this case, all of the lead frames can be utilized in their flat shapes, and therefore a forming process can be omitted.

Further, in the present embodiment, a case 160 for covering the piezoelectric oscillator element 100, the lead frames 72, 74, 76, 78, 82 and 84, and the lands 92, 94, 96 and 98 is mounted on a peripheral edge of the wiring substrate 250. By covering, with the case 160, in this way, the piezoelectric oscillator element 100 and the lead frames 72, 74, 76, 78, 82 and 84, the piezoelectric oscillator element 100 and the lead frames 72, 74, 76, 78, 82 and 84 can be protected by the case 160 and therefore, the piezoelectric transformer component 500 can be easily surface mounted without deteriorating performance of the piezoelectric transformer component 500.

External connecting terminals 110 respectively connected to the lands 92, 94, 96 and 98 are mounted to the case 160 such as to project outward.

As in the present embodiment, the external connecting terminals 110 are not directly mounted on the piezoelectric oscillator element 100, but the piezoelectric oscillator element 100 is mounted on the wiring substrate 250, the external connecting terminals 110 are mounted on the wiring substrate 250, and the piezoelectric oscillator element 100 and the external connecting terminals 110 are connected to each other through the lands 92, 94, 96 and 98 of the wiring substrate 250, thereby making the external connecting terminals 110 independent of the lead frames 72, 74, 76, 78, 82 and 84 used for connecting the piezoelectric oscillator element 100 and the wiring substrate 250. As a result, even if a large force is applied to the external connecting terminals 110 when the piezoelectric transformer component 500 is mounted on the printed wiring board 120 or the like, no force is applied to the piezoelectric oscillator element 100 itself and the lead frames 72, 74, 76, 78, 82 and 84 which connect the piezoelectric oscillator element 100 and the wiring substrate 250. Therefore, the piezoelectric transformer component 500 can be easily surface mounted without deteriorating performance of the piezoelectric transformer component 500.

Figure 4A:
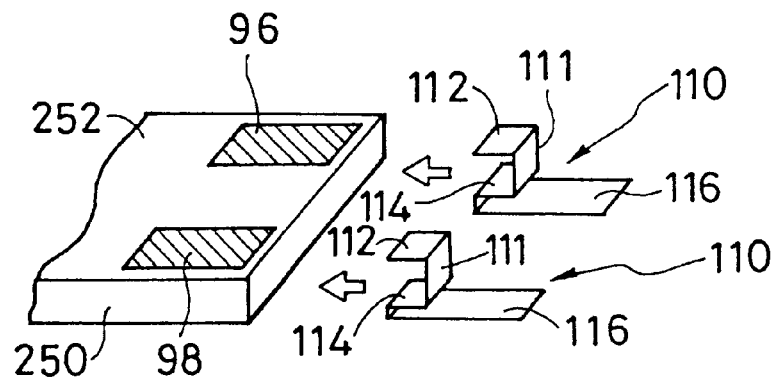
FIGS. 4A and 4B are schematic perspective views for explaining an external connecting terminal in a third embodiment of the present invention.
Figure 4B:
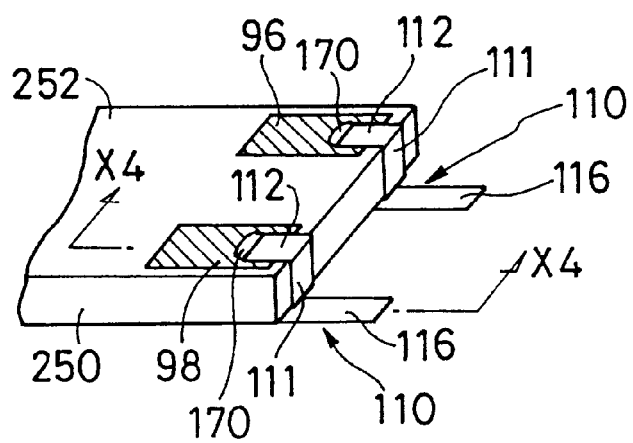
Figure 4C:
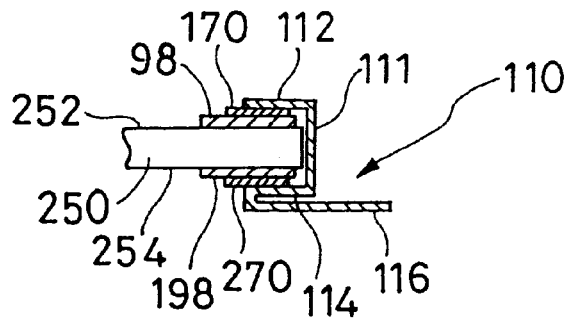
FIG. 4C is a longitudinal cross-sectional view taken along the line X4—X4 in FIG. 4B.

Referring to FIGS. 4A to 4C, the external connecting terminal 110 of the present embodiment has a structure in which a connecting portion 111 having a Japanese language of "]"-shaped cross-section or a 90-degree-counterclockwise-roated and square-cornered U-shaped cross-section is formed on a connecting portion 116. The connecting portion 111 is connected to the wiring substrate 250 on which the piezoelectric oscillator element 100 is mounted, and the connecting portion 116 is connected to an external wiring or the like such as a wiring pattern 122 on the printed wiring board 120. In the present embodiment, for example, in addition to the land 98 on the top face 252 of the wiring substrate 250, a land 198 made of copper foil is also provided on to the bottom face 254 of the wiring substrate 250, an upper connecting portion 112 of the connecting portion 111 is connected to the land 98 through a solder 170, and a lower connecting portion 114 of the connecting portion 111 is connected to the land 198 through a solder 270. Although it is not always necessary to provided the land 198 on the bottom face 254 of the wiring substrate 250, the connection strength of the external connecting terminal is increased and a reliability is enhanced if the land 198 is provided.

Figure 9A:
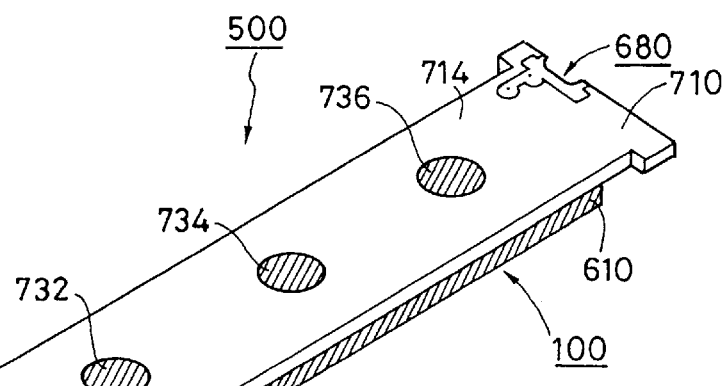
FIGS. 9A and 9B are perspective views of a piezoelectric transformer component 500 as viewing from the back side and front side, respectively, for explaining a sixth embodiment of the present invention.
Figure 9B:
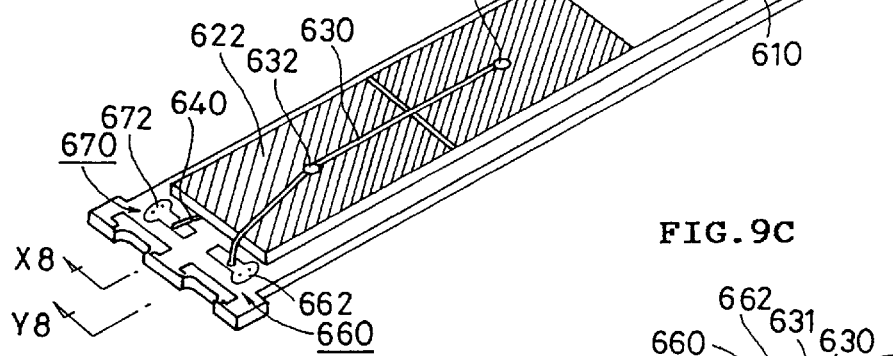
Figure 9C:
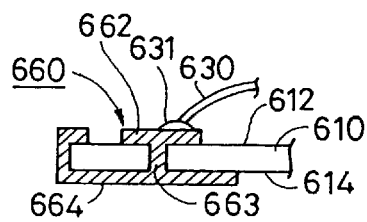
FIG. 9C is a partly enlarged longitudinal cross-sectional view taken along the line Y8—Y8 in FIG. 9B.
Figure 9D:
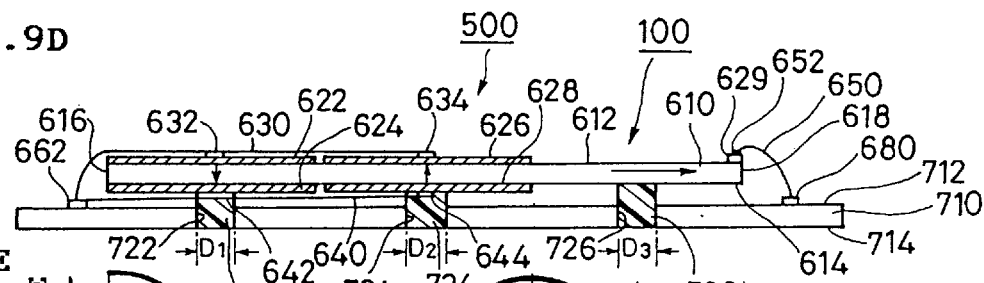
FIG. 9D is a longitudinal cross-sectional view taken along the line X8—X8 in FIG. 9B.
Figure 9E:
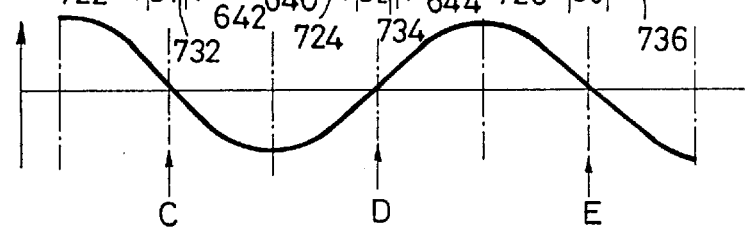
FIG. 9E is a diagram showing amplitude distribution of a piezoelectric oscillator element 100 used in the sixth embodiment of the present invention.

In the present embodiment, also, it is possible to constitute the external connecting terminal by a plating 664 which is formed by through-hole plating of a through-hole 663, as shown in FIG. 9C.

Fourth Embodiment

Figure 5A:
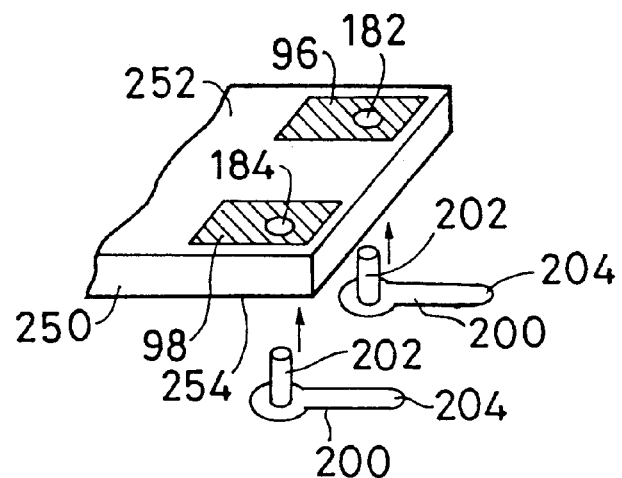
FIGS. 5A and 5B are schematic perspective views for explaining an external connecting terminal in a fourth embodiment of the present invention.
Figure 5B:
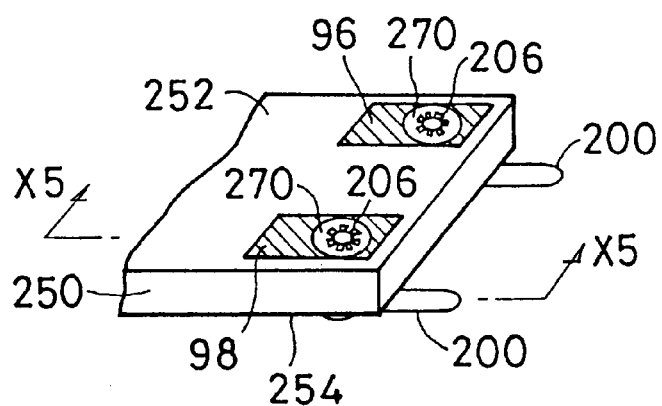
Figure 5C:
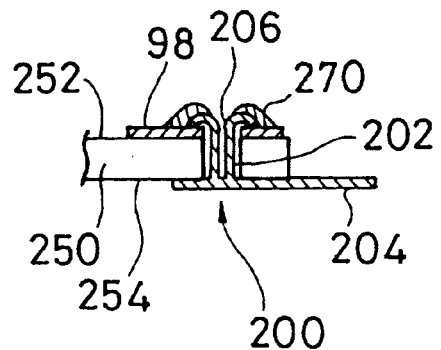
FIG. 5C is a longitudinal cross-sectional view taken along the line X5—X5 in FIG. 5B.
Figure 6A:
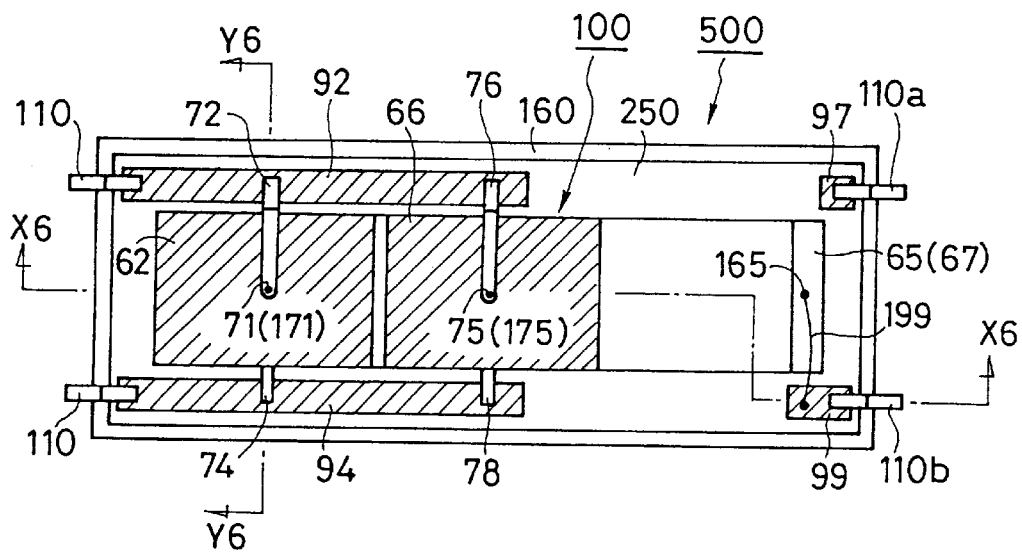
FIG. 6A is a transverse cross-sectional view taken along the line Z6—Z6 in FIG. 6C for explaining a fifth embodiment of the present invention.
Figure 6B:
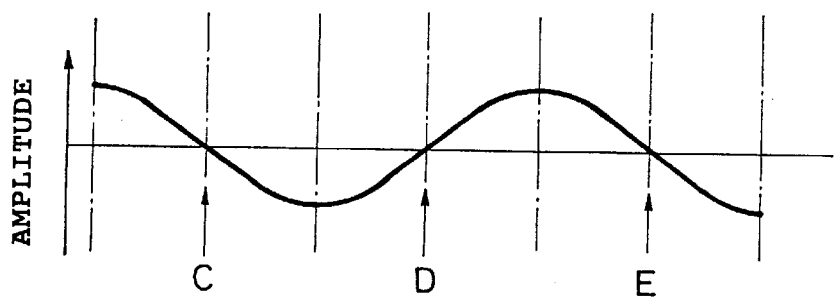
FIG. 6B is a diagram showing amplitude distribution of a piezoelectric oscillator element 100 used in the fifth embodiment of the present invention.
Figure 6C:
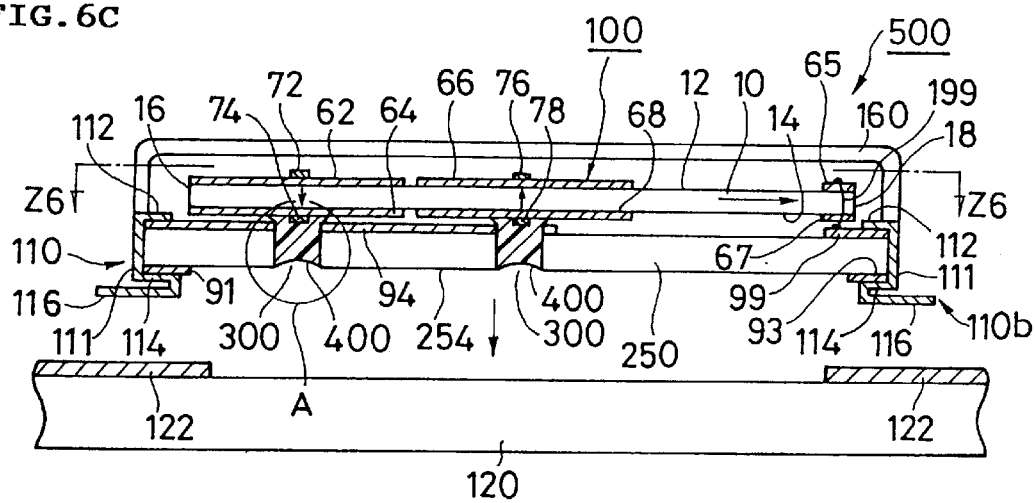
FIG. 6C is a longitudinal cross-sectional view taken along the line X6—X6 in FIG. 6A.

In the above-described third embodiment, as external connecting terminals, the external connecting terminals 110 which are shaped to sandwich the wiring substrate 250 is used. As shown in FIGS. 5A to 5C, a fourth embodiment is different from the third embodiment in that eyelet terminals 200 are used as the external connecting terminals, but other points are the same.

The eyelet terminal 200 has a base 204 and a cylindrical portion 202. The base 204 is to be connected to an external wiring or the like such as a wiring pattern 122 on the printed wiring board 120. The cylindrical portions 202 are respectively inserted into the holes 182 and 184 of the wiring substrate 250 from the side of the bottom face 254, and the cylindrical portions 202 which are projected from the top face 252 are caulked by a punch to create a plurality of opened tip ends 206. Thereafter, these portions are fixed by solders 270 to enhance a reliability of electrical conductivity.

In the present embodiment, even if there is no land such as copper foil at the side of the bottom face 254 of the wiring substrate 250, the strength of the terminal can be obtained by caulking the eyelets. Therefore, even if one-side wiring substrate having wiring pattern on one side thereof is used for the wiring substrate 250, a reliable terminal connection structure can be obtained.

Fifth Embodiment

The present embodiment is different from the third embodiment in the points described below, but other points are the same.

Further, a structure at the primary side of the piezoelectric oscillator element 100 used in the present embodiment is the same as that of the piezoelectric oscillator element 100 used in the third embodiment.

The present embodiment will be described with reference to FIGS. 6A to 6C, 7 and 8.

Figure 7:
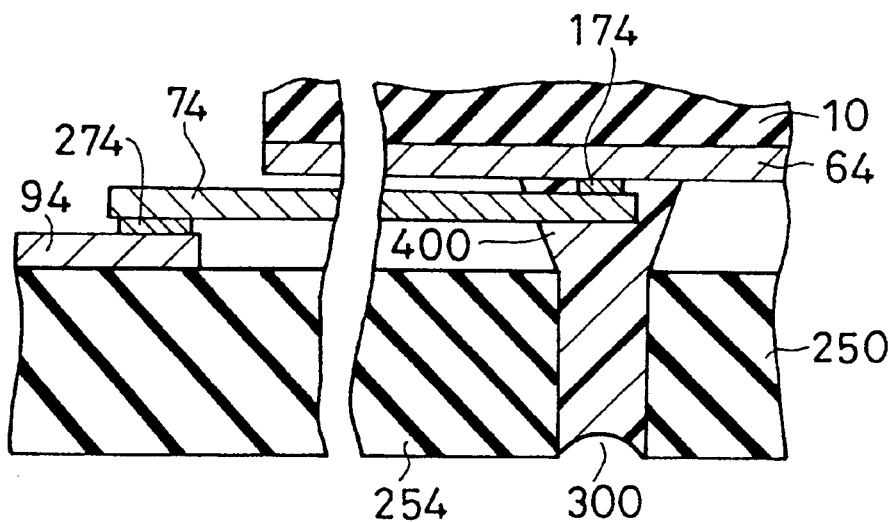
FIG. 7 is a longitudinal cross-sectional view taken along the line Y6—Y6 in FIG. 6A.
Figure 8:
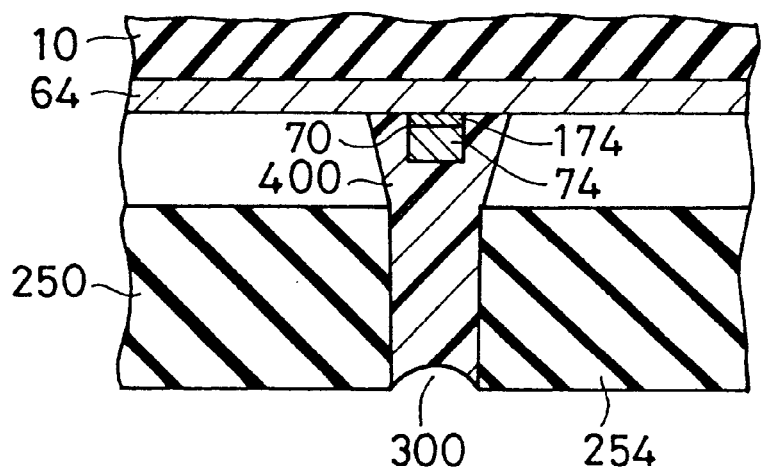
FIG. 8 is a partly enlarged cross-sectional view of a portion A in FIG. 6C.

One ends of the lead frames 72 and 74 are respectively connected to the primary-side electrodes 62 and 64 by soldering at the vibration node C respectively through the connecting portions 71 and 171 (for example, the one end of the lead frame 74 is connected to the primary-side electrode 64 through the solder 174, as shown in FIG. 7). One ends of the lead frames 76 and 78 are respectively connected to the primary-side electrodes 66 and 68 by soldering at the vibration node D respectively through the connecting portions 75 and 175. The other ends of the lead frames 72 and 76 are connected to the land 92 by soldering, and the other ends of the lead frames 74 and 78 are connected to the land 94 by soldering (for example, the other end of the lead frame 74 is connected to the land 94 through the solder 274, as shown in FIGS. 7 and 8).

At a portion of the wiring substrate 250 corresponding to a connecting portion between the lead frame 74 and the primary-side electrode 64, and at a portion of the wiring substrate 250 corresponding to a connecting portion between the lead frame 78 and the primary-side electrode 68 are respectively formed through-holes 300 having a diameter of 2 mm. A silicone rubber 400, which is a kind of commercial elastic adhesive, is charged into each of the through-holes 300, and the tip ends of the silicone rubbers 400 respectively cover the lead frame 74 in the vicinity of connecting portion between the lead frame 74 and the primary-side electrode 64, and the lead frame 78 in the vicinity of connecting portion between the lead frame 78 and the primary-side electrode 68. The piezoelectric oscillator element 100 and the wiring substrate 250 are joined together and fixed to each other by the silicone rubbers 400 at the connecting portion between the lead frame 74 and the primary-side electrode 64 and at the connecting portion between the lead frame 78 and the primary-side electrode 68.

Since the piezoelectric oscillator element 100 and the wiring substrate 250 are joined together and fixed to each other by the silicone rubbers 400 in this way, a reliability of supporting and fixing the piezoelectric oscillator element 100 to the wiring substrate 250 is enhanced. In addition, the connecting portion between the lead frame 74 and the primary-side electrode 64 is located at the vibration node C of the piezoelectric oscillator element 100, the connecting portion between the lead frame 78 and the primary-side electrode 68 is located at the vibration node D of the piezoelectric oscillator element 100, and the piezoelectric oscillator element 100 is elastically adhered and fixed by the elastic silicone rubbers. Therefore, the degradation of resonance characteristics of vibration of the piezoelectric oscillator element 100 is suppressed.

Further, the silicone rubbers are provided between the wiring substrate 250 and the lead frames 74 and 78, a shock generated between the wiring substrate 250 and the lead frames 74 and 78 can be buffered, which enhances a reliability.

Furthermore, since the silicone rubbers 300 respectively cover the lead frame 74 in the vicinity of the connecting portion between the lead frame 74 and the primary-side electrode 64, and the lead frame 78 in the vicinity of the connecting portion between the lead frame 78 and the primary-side electrode 68, it is possible to disperse the stress concentration on the piezoelectric oscillator element 100 at the portions at which edge portions 70 (see FIG. 8) of the lead frames 74 and 78 contact the piezoelectric oscillator element 100, and as a result, a higher drop impact resistance strength can be obtained. In contrast, when only the lead frames 74 and 78 are respectively connected to the primary-side electrodes 64 and 68 without providing the silicone rubbers, it is conceivable that stress concentrates on the piezoelectric oscillator element 100 at portions at which the edge portions 70 (see FIG. 8) of the lead frames 74 and 78 contact the piezoelectric oscillator element 100 and the piezoelectric oscillator element 100 is destroyed. When the silicone rubbers 400 are provided, the drop impact resistance strength was increased two times or more as compared with a case where the silicone rubbers 400 were not provided.

In the present embodiment, with the one ends of the lead frames 72, 74, 76 and 78 being respectively previously welded by solder to the primary-side electrodes 62, 64, 66 and 68, the piezoelectric oscillator element 100 was disposed such that the bottom face 14 thereof was opposed to the wiring substrate 250, the other ends of the lead frames 72 and 76 were respectively welded by solder to the land 92, and the other ends of the lead frames 74 and 78 were respectively welded by solder to the land 94. The through-holes 300 were previously formed in the wiring substrate 250 at a position corresponding to the connecting portion between the lead frame 74 and the primary-side electrode 64 and at a position corresponding to the connecting portion between the lead frame 78 and the primary-side electrode 68, and the commercial silicone rubbers 400 were injected from the through-holes 300 by a dispenser by constant amounts, respectively.

Although a silicone rubber having adhesive properties was used as the silicone rubber 400 in the present embodiment, a silicone rubber having no adhesive properties can also be used. In this case, the shock can be buffered utilizing elasticity of the silicone rubber.

In the secondary side, secondary-side electrodes 65 and 67 are respectively disposed on the top face 12 and the bottom face 14 in the vicinity of the secondary-side end surface 18. The portion of the piezoelectric ceramics substrate 10 between the primary-side electrodes 66, 68 and the secondary-side electrodes 65, 67 is polarized in the longitudinal direction of the piezoelectric ceramics substrate 10. The secondary-side electrode 65 is connected to a land 99 by a lead wire 199 through a connecting portion 165. The connecting portion 165 is provided at the center portion in the widthwise direction of the piezoelectric ceramics substrate 10. An external connection terminal 110b is fitted to the land 99. The wiring substrate 250 is further provided with a land 97, and an external connection terminal 110a is fitted to the land 97. The land 97 and the external connection terminal 110a are not electrically connected to the piezoelectric oscillator element 100, but serve for mechanically mounting the piezoelectric transformer component 500 on the printed wiring board 120.

Sixth Embodiment

The present embodiment will be explained with reference to FIGS. 9A to 9E.

A piezoelectric transformer component 500 according to the present invention includes a glass epoxy substrate 710 and a piezoelectric ceramics substrate 610 mounted on a surface 712 of the glass epoxy substrate 710.

The left ⅔ of the piezoelectric ceramics substrate 610 is a primary side, primary-side electrodes 622 and 626 are disposed on the top face 612 of the piezoelectric ceramics substrate 610, and primary-side electrodes 624 and 628 are disposed on the bottom face 614. A portion of the piezoelectric ceramics substrate 610 between the primary-side electrodes 622 and 624 is polarized downward in the thicknesswise direction of the piezoelectric ceramics substrate 610, a portion of the piezoelectric ceramics substrate 610 between the primary-side electrodes 626 and 628 is polarized upward in the thicknesswise direction of the piezoelectric ceramics substrate 610, the primary-side electrodes 622 and 626 are connected, and the primary-side electrodes 624 and 628 are connected, so that each one of resonance of the whole piezoelectric ceramics substrate 610 excited by the portion of the piezoelectric ceramics substrate 610 between the primary-side electrodes 622 and 624 and resonance of the whole piezoelectric ceramics substrate 610 excited by the portion of the piezoelectric ceramic substrate 610 between the primary-side electrodes 626 and 628 increases the other's resonance.

The right ⅓ of the piezoelectric ceramics substrate 610 is a secondary side, and is polarized in the longitudinal direction of the piezoelectric ceramics substrate 610. A secondary-side electrode 629 is disposed on the top face at the right end of the piezoelectric substrate, and an increased voltage is produced and led out.

The piezoelectric ceramics substrate 610 as constituted in the above-described manner functions as a piezoelectric transformer, and can be driven such that e.g., 1.5 wavelength vibration mode is established between the primary-side end surface 616 and the secondary-side end surface 618. In this case, there appear nodes C, D and E of longitudinal vibration at positions located ⅙, ⅜ and ⅚ of the longitudinal length of the piezoelectric ceramics substrate 610 as measured from the primary-side end surface 616. Nodes of widthwise vibration are located on the center line in the sidethwise direction of the piezoelectric ceramics substrate 610.

In the present embodiment, through-holes 722, 724 and 726 are respectively formed in the glass epoxy substrate 710 at positions which respectively correspond to the longitudinal vibration nodes C, D and E and which are on the center line in the widthwise direction of the piezoelectric ceramics substrate 60, silicone rubber adhesive is injected from the back surface 714 of the glass epoxy substrate 710 respectively through the through-holes 722, 724 and 726, thereby joining the piezoelectric ceramics substrate 610 and the glass epoxy substrate 710 together by spot-like silicone rubbers 732, 734 and 736. Diameters D1, D2 and D3 of the through-holes 622, 624 and 626 are all set to be 2.5 mm, and a distance between the bottom face 614 of the piezoelectric ceramics substrate 610 and the surface 712 of the glass epoxy substrate 710 is set to be 0.3 mm.

In the present embodiment, the vibration nodes C, D and E of the piezoelectric oscillator element 100 are respectively supported by the silicone rubbers 732, 734 and 736 in this way, hindrance to vibration is suppressed. Further, since the piezoelectric oscillator element 100 is supported by the silicone rubbers which are elastic materials, the lead wire for leading out from an electrode need not support the piezoelectric ceramics substrate 610, and therefore the lead wire does not require rigidity, and the wiring can be freely achieved.

In the present embodiment, seven lead stranded wires 630, 640 and 650 having a diameter of 0.03 mm were used as the lead wires for leading out from the electrodes. The lead stranded wire 630 was respectively connected to the primary-side electrodes 626 and 622 by solders 634 and 632, and one end of the lead stranded wire or 630 was connected to a land 662 disposed on the surface 712 of the glass epoxy substrate 710 by a solder 631. The lead stranded wire 640 was respectively connected to the primary-side electrodes 628 and 624 by solders 644 and 642, and one end of the lead stranded wire 640 is connected to a land 672 disposed on the surface 712 of the glass epoxy substrate 710 by a solder. The lead stranded wire 650 was connected to the secondary-side electrode 629 by a solder 652, and one end of the lead stranded wire 650 was connected to a land 682 disposed on the surface 712 of the glass epoxy substrate 710 by a solder.

In this way, since the lead stranded wires 630, 640 and 650 are led out only in the longitudinal direction of the piezoelectric ceramics substrate 610 in the present embodiment, the width of the piezoelectric transformer component 500 can be made substantially equal to the width of the piezoelectric ceramics substrate 610.

The lands 662, 672 and 682 are respectively formed as portions of the external connecting terminals 660, 670 and 680. Of these external connecting terminals 660, 670 and 680, if the case of the terminal 660 is taken as a example, this is formed of a plating 664 which is formed by through-hole plating the through-hole 663, as shown in FIG. 9C.

Next, referring to FIGS. 10A to 10E, the manufacturing method of the piezoelectric transformer of the present embodiment will be explained.

Figure 10A:
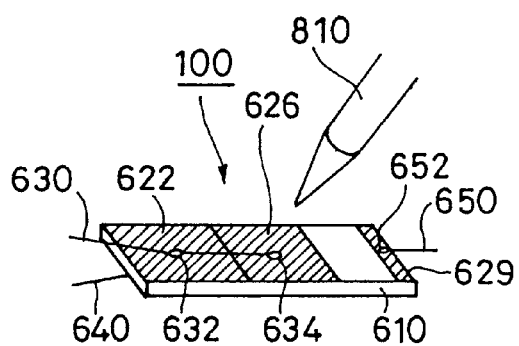
FIGS. 10A to 10E are diagrams for explaining a manufacturing method for the piezoelectric transformer 500 according to the sixth embodiment of the present invention.

First, as shown in FIG. 10A, the lead stranded wire 630 is connected to the primary-side electrodes 622 and 626 of the piezoelectric oscillator element 100, the lead stranded wire 640 is connected to the primary-side electrodes 624 and 628, and the lead stranded wire 650 is connected to the secondary-side electrode 629.

Figure 10B:
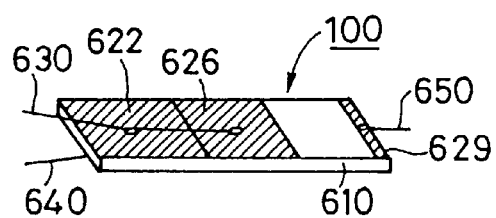

Next, as shown in FIG. 10B, the piezoelectric oscillator element 100 to which the lead stranded wires 630, 640 and 650 are connected by solders is cleaned by ultrasonic cleaning. The ultrasonic cleaning is conducted such that the piezoelectric oscillator element 100 is cleaned in alcohol for 30 seconds, in pure water for 30 seconds and then in acetone.

Figure 10C:
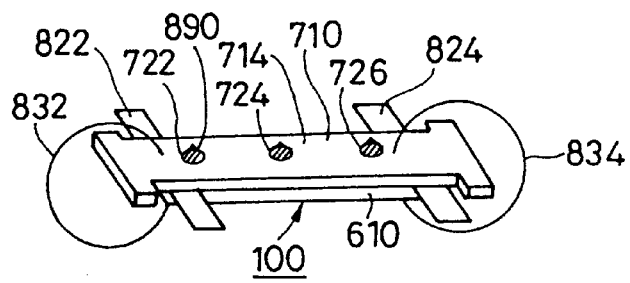

Then, as shown in FIG. 10C, the piezoelectric ceramic substrate 610 and the glass epoxy substrate 710 are joined together by silicone rubbers 890. In this case, the piezoelectric ceramic substrate 610 and the glass epoxy substrate 710 are fixed by clamps 832 and 834 in a state where spacers 822 and 824 having a thickness of 0.3 mm are sandwiched between the substrates, and silicone rubber 890 is injected from the back surface 714 of the glass epoxy substrate 710 respectively through the through-holes 722, 724 and 726, thereby joining the piezoelectric ceramics substrate 610 and the glass epoxy substrate 710 together.

Figure 10D:
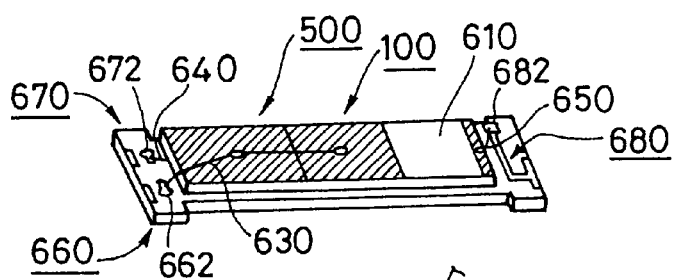

Next, as shown in FIG. 10D, the lead stranded wires 630, 640 and 650 are respectively connected to the lands 662, 672 and 682 of the glass epoxy substrate by solders.

Figure 10E:
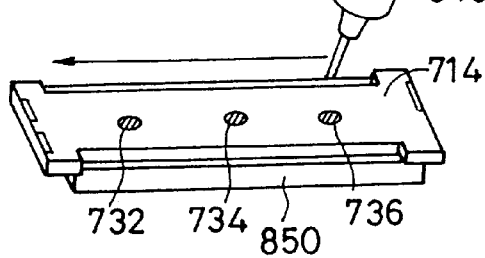

Then, as shown in FIG. 10E, a lid 850 made of ABS resin is adhered by acrylic-type ultraviolet-curing adhesive using an adhesive dispenser 840.

Seventh Embodiment

The present embodiment will be explained with reference to FIGS. 11A to 11D.

The piezoelectric transformer component 500 according to the present invention includes a glass epoxy substrate 710 and a piezoelectric ceramics substrate 610 which is mounted on a surface 712 of the glass epoxy substrate 710.

The left ½ of the piezoelectric ceramics substrate 610 is a primary side, primary-side electrodes 621 and 623 are respectively disposed on the top face 612 and the bottom face 614 of the piezoelectric ceramics substrate 610. A portion of the piezoelectric ceramics substrate 610 between the primary-side electrodes 621 and 623 is polarized in the thicknesswise direction of the piezoelectric ceramics substrate 610.

The right ½ of the piezoelectric ceramics substrate 610 is a secondary side, and is polarized in the longitudinal direction of the piezoelectric ceramics substrate 610. A secondary-side electrode 625 is disposed on the top face at the right end of the piezoelectric substrate, and an increased voltage is produced and led out.

The piezoelectric ceramics substrate 610 as constituted in the described manner functions as a piezoelectric transformer, and can be driven such that e.g., one wavelength vibration mode is established between the primary-side end surface 616 and the secondary-side end surface 618. In this case, there appear vibration nodes A and B of longitudinal vibration at positions respectively located ¼ and ¾ of the longitudinal length of the piezoelectric ceramics substrate 610 as measured from the primary-side end surface 616. Nodes of widthwise vibration are located on the center line in the widthwise direction of the piezoelectric ceramics substrate 610.

In the present embodiment, through-holes 721 and 723 are respectively formed in the glass epoxy substrate 710 at positions which respectively correspond to the longitudinal vibration nodes A and B and which are on the center line in the widthwise direction of the piezoelectric ceramics substrate 610, and silicone rubber adhesive is injected from the back surface 714 of the glass epoxy substrate 710 respectively through the through-holes 721 and 723, thereby joining the piezoelectric ceramics substrate 610 and the glass epoxy substrate 710 together by spot-like silicone rubbers 731 and 733. Diameters D4 and D5 of the through-holes 721 and 723 are all set to be 2.5 mm, and a distance between the bottom face 614 of the piezoelectric ceramics substrate 610 and the surface 712 of the glass epoxy substrate 710 is set to be 0.3 mm.

In the present embodiment, the vibration nodes A and B of the piezoelectric oscillator element 100 are respectively supported by the silicone rubbers 731 and 733 in this way, hindrance to vibration is suppressed. Further, since the piezoelectric oscillator element 100 is supported by the silicone rubbers which are elastic materials, the lead wire for leading out from an electrode need not support the piezoelectric ceramics substrate 610, and therefore the lead wire does not require rigidity, and the wiring can be freely achieved.

In the present embodiment, seven lead stranded wires 635 and 645 having a diameter of 0.03 mm were used as the lead wires for leading out from the electrodes. The lead stranded wire 635 was connected to the primary-side electrode 621 by solder 637, and one end of the lead stranded wire 635 was connected to a land 662 disposed on the surface 712 of the glass epoxy substrate 710 by a solder. The lead stranded wire 645 was connected to the primary-side electrode 623 by a solder 647, and one end of the lead stranded wire 645 is connected to a land 672 disposed on the surface 712 of the glass epoxy substrate 710 by a solder. The lead stranded wire 655 was connected to the secondary-side electrode 625 by a solder 657, and one end of the lead stranded wire 655 was connected to a land 682 disposed on the surface 712 of the glass epoxy substrate 710 by a solder.

In this way, since the lead stranded wires 633, 645 and 655 are led out only in -the longitudinal direction of the piezoelectric ceramics substrate 610 in the present embodiment, the width of the piezoelectric transformer component 500 can be made substantially equal to the width of the piezoelectric ceramics substrate 610.

Further, in each of the above-described sixth and seventh embodiments, since the external connecting terminals 660, 670 and 680 are disposed on the end portions in the longitudinal direction of the glass epoxy substrate 710, when the piezoelectric transformer component 500 is assembled to a circuit, its width can be kept narrow.

INDUSTRIAL APPLICABILITY

According to the present invention, as described above, a supporting structure for the piezoelectric oscillator element and a structure of the piezoelectric oscillator component become simplified, the structures can easily be made thinner, and the surface mounting can easily be achieved.

Further, the piezoelectric transformer component having a small size in the widthwise direction is also provided.

As a result, the present invention can preferably utilized especially for a piezoelectric transformer for lighting a cold cathode fluorescent lamp as a backlight of a liquid crystal display, for a supporting structure thereof, and a surface mounting method thereof.

We claim:

1. A piezoelectric transformer component, comprising a piezoelectric oscillator element having an electrode on a surface thereof, a mounting substrate having a through-hole, and an external connecting terminal of said piezoelectric oscillator component, wherein said piezoelectric oscillator element is mounted on said mounting substrate, said mounting substrate is fitted with or provided with said external connecting terminal, said electrode of said piezoelectric oscillator element and said external connecting terminal are electrically connected to each other through a conductive member, a part of said conductive member is electrically connected to said electrode at a connecting position, said piezoelectric transformer and said mounting substrate are joined together through an elastic adhesive, said elastic adhesive covers said electrode and said conductive member at least at said connection position, said through-hole of said mounting substrate is located at a position corresponding to said connection position, and a part of said elastic adhesive is inserted into said through-hole.

2. A piezoelectric transformer component as recited in claim 1, wherein said connection position is located on the center line of said piezoelectric oscillator element in the widthwise direction thereof and at a position of 1/n (n is an integer equal to or greater than 2) of the length of said piezoelectric oscillator element in the longitudinal direction thereof times m (m is an integer small than n), and said piezoelectric oscillator element and said mounting substrate are joined together through said elastic adhesive at said connection position.

3. A piezoelectric transformer component as recited in claim 1, wherein said connecting position is located at a node of vibration of said piezoelectric oscillator element, and said piezoelectric oscillator element and said mounting substrate are joined together through said elastic adhesive at said node.

4. A piezoelectric transformer mounting method for mounting a piezoelectric oscillator element on a mounting substrate, comprising the steps of:

providing a through-hole at a predetermined portion of said mounting substrate which is located on the center line of said piezoelectric oscillator element in the widthwise direction thereof and which correspond to a position of 1/n (n is an integer equal to or greater than 2) of the length of said piezoelectric oscillator element in the longitudinal direction thereof times m (m is an integer smaller than n), and injecting an elastic adhesive through said through-hole and from a face of said mounting substrate, which is opposite to a face thereof on which said piezoelectric oscillator element is mounted, thereby joining said piezoelectric oscillator element and said mounting substrate together by said elastic adhesive.

5. A piezoelectric transformer mounting method for mounting a piezoelectric oscillator element on a mounting substrate, comprising the steps of:

providing a through-hole at a predetermined portion of said mounting substrate which corresponds to a node of vibration of said piezoelectric oscillator element, and injecting an elastic adhesive through said through-hole and from a face of said mounting substrate, which is opposite to a face thereof on which said piezoelectric oscillator element is mounted, thereby joining said piezoelectric oscillator element and said mounting substrate together by said elastic adhesive.

* * * * *